(12) United States Patent
Oike et al.

(10) Patent No.: US 8,574,955 B2
(45) Date of Patent: Nov. 5, 2013

(54) METHOD FOR PRODUCING LIGHT-EMITTING FILM AND LIGHT-EMITTING DEVICE

(75) Inventors: Tomoyuki Oike, Yokohama (JP); Tatsuya Iwasaki, Machida (JP); Yoshihiro Ohashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 137 days.

(21) Appl. No.: 13/297,027

(22) Filed: Nov. 15, 2011

(65) Prior Publication Data

US 2012/0064654 A1 Mar. 15, 2012

Related U.S. Application Data

(62) Division of application No. 12/185,261, filed on Aug. 4, 2008, now Pat. No. 8,084,782.

(30) Foreign Application Priority Data

Aug. 10, 2007 (JP) .................................. 2007-209985
Mar. 12, 2008 (JP) .................................. 2008-062866
Mar. 12, 2008 (JP) .................................. 2008-062867

(51) Int. Cl.
*H01L 21/00* (2006.01)
*H01L 29/24* (2006.01)

(52) U.S. Cl.
USPC .................... 438/104; 257/103; 257/E33.013

(58) Field of Classification Search
USPC ............ 257/79, 102, 103, E33.013, E33.043; 438/104
See application file for complete search history.

(56) References Cited

U.S. PATENT DOCUMENTS

| | | | |
|---|---|---|---|
| 4,107,724 A | 8/1978 | Ralph | |
| 4,916,496 A | 4/1990 | Tomomura et al. | |
| 4,988,579 A | 1/1991 | Tomomura et al. | |
| 5,037,709 A | 8/1991 | Tomomura et al. | |
| 5,055,363 A | 10/1991 | Tomomura et al. | |
| 5,187,116 A | 2/1993 | Kitagawa et al. | |
| 2005/0104509 A1* | 5/2005 | Yamashita | 313/503 |
| 2006/0043380 A1 | 3/2006 | Hiroshi et al. | |
| 2006/0157717 A1 | 7/2006 | Nagai et al. | |
| 2007/0194306 A1 | 8/2007 | Yamazaki et al. | |
| 2007/0278948 A1* | 12/2007 | Sakata et al. | 313/506 |

FOREIGN PATENT DOCUMENTS

| | | |
|---|---|---|
| JP | 2-087685 A | 3/1990 |
| JP | 3-038073 A | 2/1991 |
| JP | 6-097704 B2 | 11/1994 |
| JP | 2002-232010 A | 8/2002 |
| JP | 2006-179511 A | 7/2006 |
| WO | 03/071608 A1 | 8/2003 |

OTHER PUBLICATIONS

Masatoshi Shiiki et al., "Electroluminescence of Zinc Sulfide Thin Films Activated with Donors and Acceptors," 117 Journal of Crystal Growth 1035-1039 (1992).

* cited by examiner

*Primary Examiner* — Matthew E Warren
(74) *Attorney, Agent, or Firm* — Fitzpatrick, Cella, Harper & Scinto

(57) ABSTRACT

Provided is a light-emitting film having controllable resistivity, and a high-luminance light-emitting device, which can be driven at a low voltage, using such light-emitting film. The light-emitting film includes Cu as an addition element in a zinc sulfide compound which is a base material, wherein the zinc sulfide compound includes columnar ZnS crystals, and sites formed of copper sulfide on a grain boundary where the ZnS crystals are in contact with each other.

10 Claims, 11 Drawing Sheets

METHOD FOR PRODUCING LIGHT-EMITTING FILM AND LIGHT-EMITTING DEVICE

CROSS-REFERENCE TO RELATED APPLICATIONS

This Application is a division of application Ser. No. 12/185,261, filed Aug. 4, 2008, now U.S. Pat. No. 8,084,782, which claims the benefit of Japanese Patent Application No. 2007-209985, filed Aug. 10, 2007, Japanese Patent Application No. 2008-062866, filed Mar. 12, 2008, and Japanese Patent Application No. 2008-062867, filed Mar. 12, 2008. All prior applications are hereby incorporated by reference herein in their entirety.

BACKGROUND OF THE INVENTION

1. Field of the Invention

The present invention relates to a light-emitting film, a light-emitting device, and a production method thereof. More specifically, the present invention relates to a light-emitting film and a light-emitting device which can be utilized in LEDs and inorganic ELs, and a production method thereof.

2. Description of the Related Art

Recently, the advances in research of light-emitting devices having high-luminance emission have been remarkable, with light-emitting devices based on various operational principles being developed. Examples include LEDs and LDs which emit light by the recombination of electrons and holes injected in semiconductor pn junctions formed of high-quality crystals; and inorganic ELs which emit light by electrical field excitation by applying a high electric field to an insulating phosphor thin film and exciting a light-emitting center in the phosphor thin film with hot electrons. Further examples include organic ELs obtained by laminating a light-emitting layer, an electron transporting layer, and a hole transporting layer formed of organic molecules or a polymer thin film, which cause exciton emission that is localized in the organic molecules by the recombination energy between the injected electrons and holes. Among these, although LEDs and organic ELs, which are capable of high-luminance emission by a DC drive, have been effectively incorporated into people's daily life, the fact remains that there is a need for even higher luminance and improved energy consumption. In addition, there is also a strong need for technological development of light-emitting devices which can be produced more easily and which have high durability.

Currently, in response to the above needs, the following light-emitting devices have been developed. In the "Journal of Crystal Growth 117 (1992) 1035-1039", light-emitting devices having a MIS (Metal-Insulator-Semiconductor) structure and a MISIM (Metal-Insulator-Semiconductor-Insulator-Metal) structure have been reported. The light-emitting film is a semiconductor layer using ZnS:Ag,Cl for the donor-acceptor-pair recombination. The Ag/Zn atom number ratio is 30 to 50 ppm, which is very low. Thus, the light-emitting device is AC-driven, and the emission starting voltage is 35 Vrms. The emitted luminance at 50 Vrms is 30 cd/m$^2$. Further, the journal article contains no description regarding the resistivity of the light-emitting film. In addition, a MOCVD method is used for the production of such a light-emitting film, and the deposition rate is 20 nm/min.

Japanese Patent Publication No. H06-097704 discloses a light-emitting device in which, in order to perform MIS structure hole injection emission stably, the I layer is formed from two or more hole injection high-resistance insulating layers. Low-resistance single crystal ZnS or epitaxial crystal film is used in the light-emitting portion. Further, the single crystal ZnS does not contain an addition element, and the resistivity is 1 to 5 Ωcm. The external quantum efficiency is about 0.08%.

FIG. 20 illustrates a schematic diagram of a typical conventional DC drive-distributed EL device described in "Phosphor Handbook" (Phosphor Research Society, 1987, page 326). In the DC drive-distributed EL device, a DC current pathway is formed by coating Cu$_x$S 52, which has higher electroconductivity than ZnS, on granular ZnS crystals 60 by a forming treatment. This "forming treatment" is a treatment in which current is flowed with a transparent electrode 58 as the positive and an electrode 59 as the negative to form a high-resistance region about 1 μm in thickness, in which Cu$^+$ ions are depleted on the transparent electrode 58 side by making the mobile Cu$^+$ ions move to the electrode 59 side so that the Cu$_x$S is segregated. Further, the Cu$_x$S coating the granular ZnS crystals also acts as a carrier source. Specifically, since Cu$_x$S has a higher electroconductivity than ZnS, an electric field concentrates on the Cu$_x$S which has segregated in a differential region when voltage is applied. As a result, the electrons of the valence band of the Cu$_x$S are trapped in the donor level of the base ZnS, and the holes are trapped in the acceptor level. It is believed that light is emitted by the recombination of the electrons trapped in the donor level with the holes trapped in the acceptor level.

However, in the above-described conventional light-emitting device, the light-emitting film cannot itself be provided with both light-emitting capabilities and a desired resistivity. As a result, the emission starting voltage increases, and it is more difficult to obtain high-luminance emission. Further, to realize a conventional light-emitting device, complex productions processes, such as a MOCVD method, a single crystal production method and its resistivity control method, and an epitaxial deposition method, are required, meaning that production is not simple.

SUMMARY OF THE INVENTION

The present invention was created in view of the above-described problems. It is an object of the present invention to provide a high-luminance light-emitting device which can be driven at a low voltage by, in a light-emitting film which includes an addition element in a zinc sulfide compound, combining light-emitting capabilities and a desired resistivity, and also by laminating such light-emitting film with a film having a greater resistivity than the light-emitting film.

The present invention is a light-emitting film including Cu as an addition element in a zinc sulfide compound which is a base material, wherein the zinc sulfide compound includes columnar ZnS crystals, and sites formed of copper sulfide on a grain boundary where the ZnS crystals are in contact with each other.

Further, the present invention is a light-emitting device, which includes a film having a greater resistivity than the above-described light-emitting film, the above-described light-emitting film, and a transparent electrode film, which are stacked in layers in that order on a substrate.

Further, the present invention is a method for producing a light-emitting film, including depositing a light-emitting film by supplying Cu metal and a zinc sulfide compound onto a substrate in a hydrogen sulfide atmosphere, wherein the ratio between the Cu metal supply rate (nm/min) and the zinc sulfide compound supply rate (nm/min) is 1:1,000 or more and 1:10 or less.

Further, the present invention is a method for producing a light-emitting device at least including: depositing a film having a greater resistivity than the above-described light-emitting film onto a substrate; depositing the light-emitting film by the above-described method onto the film having a greater resistivity than the light-emitting film; and depositing a transparent electrode film onto the light-emitting film.

According to the present invention, a light-emitting film which combines light-emitting capabilities and a desired resistivity, and a high-luminance light-emitting device using such light-emitting film which can be driven at a low voltage can be provided. Further, according to the production method of the present invention, the light-emitting film can be efficiently produced by a simpler method.

Further features of the present invention will become apparent from the following description of exemplary embodiments with reference to the attached drawings.

DESCRIPTION OF THE EMBODIMENTS

Embodiment 1

A first embodiment of the present invention will now be described.

The light-emitting film according to the present embodiment includes Cu as an addition element in a zinc sulfide compound which is the base material. The zinc sulfide compound has columnar ZnS crystals, and has sites formed of copper sulfide on a grain boundary where the ZnS crystals are in contact with each other.

Elements other than Cu may be added to the light-emitting film according to the present embodiment. Specifically, to obtain excellent light-emitting capabilities, it is more desirable to use for the material of the light-emitting film a donor-acceptor pair light-emitting material which emits light from the recombination of electrons and holes. The donor-acceptor pair light-emitting material has respective energy levels formed by the donor and the acceptor added to a semiconductor which is the base material. Electrons and holes trapped therein recombine, thereby emitting light. If the wide gap semiconductor ZnS (Eg=3.7 eV) is used as the base material, a visible emission can be obtained. The light-emitting material is expressed as ZnS:A,D, and the emitted color is determined by the energy difference between the formed donor energy level and acceptor energy level. Light emitted from a deep donor-acceptor pair formed in a ZnS base material is bright even at room temperature, so such a material is widely used in applications such as a phosphor for a color television cathode-ray tube and a phosphor for distributed electroluminescence. For example, an emission having a peak at about 2.4 eV can be obtained from ZnS:Cu,Al and ZnS:Cu,Ga, and about 2.7 eV from ZnS:Cu,Cl.

Next, the structure of the light-emitting film according to the present embodiment will be described in more detail.

Figure 1:
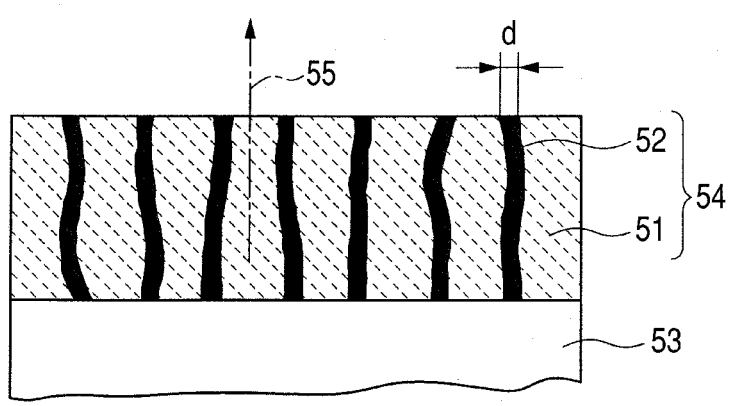
FIG. 1 is a schematic diagram illustrating a cross-sectional view of the light-emitting film according to the present invention.
Figure 2:
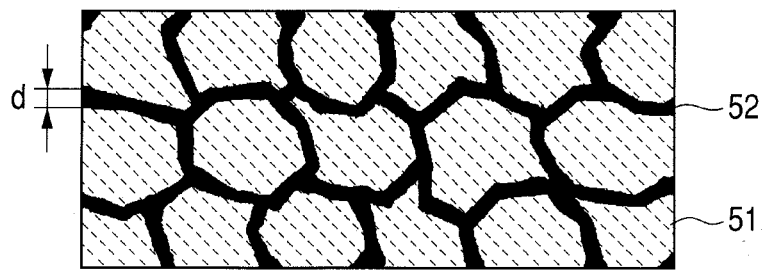
FIG. 2 is a schematic diagram illustrating a planar view of the light-emitting film according to the present invention.

As illustrated in FIGS. 1 and 2, the light-emitting film according to the present embodiment includes columnar ZnS crystals 51, and has sites formed of copper sulfide $Cu_xS$ 52 on a grain boundary where the ZnS crystals are in contact with each other. The thickness d of the $Cu_xS$ is 3 nm or less, and the $Cu_xS$ is formed in the light-emitting film so as to cover the columnar crystals of ZnS.

Figure 3:
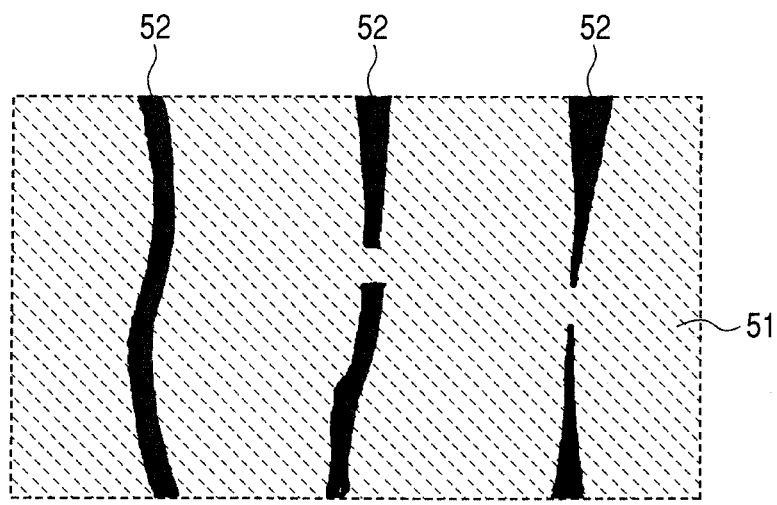
FIG. 3 is an enlarged view of the grain boundary where the ZnS crystals of the light-emitting film according to the present invention are in contact with each other.

$Cu_xS$ has five stable phases for when x is between 1 and 2, which are respectively $Cu_1S$ (x=1), $Cu_{1.75}S$ (x=1.75), $Cu_{1.8}S$ (x=1.8), $Cu_{1.96}S$ (x=1.96), and $Cu_2S$ (x=2). These examples of $Cu_xS$ have lower resistance than the ZnS crystals. Since the $Cu_xS$ according to the present embodiment is formed so as to penetrate through the film, the $Cu_xS$ is believed to have a role as a current pathway, which allows the whole film to be a low-resistance light-emitting film. Further, the thickness of the $Cu_xS$ is not constant throughout the light-emitting film. The $Cu_xS$ thickness may be thinner or thicker within the range of 3 nm or less depending on the region. As illustrated in FIG. 3, there are regions which are narrow like a needle, and regions which seem to be discontinued midway along. Since electric field tends to concentrate on the high-conductivity $Cu_xS$, in regions such as this it is believed that localized high electric field regions are formed. Here, if the thickness of the $Cu_xS$ is more than 3 nm, the resistance of the device as a whole becomes too small, so that a large current flows and drive stability deteriorates. Further, because microscopically it becomes more difficult for localized high electric field regions to form, luminance is decreased. Therefore, by setting the thickness d of the $Cu_xS$ to 3 nm or less, a light-emitting film which combines low voltage drive and high-luminance can be produced.

Further, the resistivity of the $Cu_xS$ varies according to its composition, with the resistivity increasing as x increases. Since the value of x varies in the range of 1.75 or more to 2 or less, the $Cu_xS$ at the grain boundary of the light-emitting film according to the present embodiment is believed to form regions whose resistivity increases or decreases in a localized manner according to the variation in this composition. Even at such regions it is believed that localized high electric field regions are similarly formed. Hence, it is thought that the high electric field regions are formed in the light-emitting film according to the size and composition characteristics which the $Cu_xS$ at the grain boundary of the light-emitting film according to the present embodiment may take. At the thus-formed high electric field regions, the electrons of the valence band of the $Cu_xS$ are trapped in the donor level of the base ZnS, and the holes are trapped in the acceptor level, whereby the $Cu_xS$ is believed to act as a carrier source. Therefore, it is thought that high-luminance can be obtained by the recombination of the electrons trapped in the donor level of the ZnS with the holes trapped in the acceptor level. Thus, in the present embodiment, since the $Cu_xS$ which penetrates through the light-emitting film has both a role as a current pathway and a role as a carrier source, by having the structure of the present embodiment, a light-emitting film which can be driven at a low voltage with high-luminance can be produced.

Figure 20:
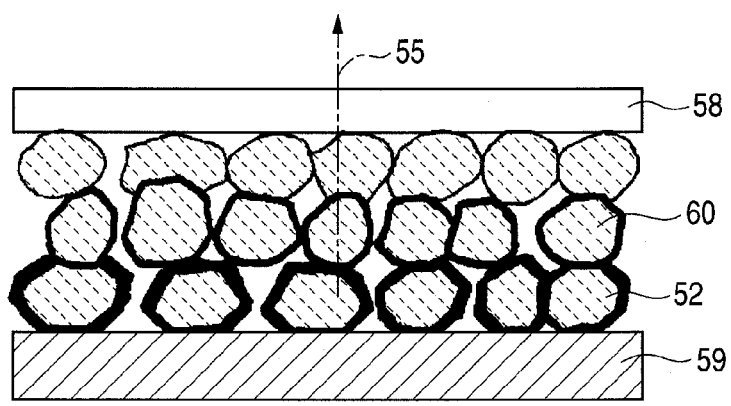
FIG. 20 is a schematic diagram illustrating a cross-sectional view of a conventional DC drive-distributed EL device.

In the present embodiment, the light-emitting film has sites such that the amount of $Cu_xS$ at the grain boundary where ZnS crystals are in contact with each other is 30 times or more the amount of $Cu_xS$ at a boundary formed by ZnS crystals and a material other than ZnS crystals. This means that the $Cu_xS$ layer is only present on the grain boundary between ZnS crystals, and is not present between the ZnS crystals and the substrate or upper electrode. By having such a structure, the advantage of an improvement in the extraction efficiency of light can be obtained. The reason for this is as follow. $Cu_xS$ having a value for x in the range of 1.75 or more to 2 or less exhibits absorption in the visible region, so that the emission from the ZnS is absorbed. Especially, $Cu_2S$, which has a value for x of 2, has a band gap of about 1.2 eV, so that its absorption coefficient in the visible region is a high value of $\alpha=10^5$ $cm^{-1}$. For the conventional DC drive-distributed EL device illustrated in FIG. 20, granular ZnS crystals 60 having a surface coated with $Cu_xS$ are stacked. Therefore, the emission 55 released from the light-emitting film interior must inevitably pass through many layers of the $Cu_xS$ 52 until it has exited, so that the emission from the ZnS crystals attenuates as a result of absorption. On the other hand, the light-emitting film 54 according to the present invention illustrated in FIGS. 1 and 2 is formed of columnar ZnS crystals 51 which have grown perpendicularly to a substrate 53, and $Cu_xS$ 52 formed so as to coat these ZnS crystals 51. Therefore, the emission 55 from the ZnS crystals 51 can exit externally without passing through the $Cu_xS$ 52. As a result, there is no effect of absorption from the $Cu_xS$ 52, so that the light-emitting film has high-luminance with improved external light-extraction efficiency.

As shown above, the $Cu_xS$ which penetrates through the light-emitting film allows low voltage drive due to having a role as a current pathway. Further, the $Cu_xS$ also allows light to be emitted highly efficiently due to having a role as a carrier source. In addition, such emission is not affected from absorbance by the $Cu_xS$. By externally extracting the emission, a high-luminance light-emitting film can be obtained.

Next, a light-emitting film to which Cu and one or more elements selected from the group consisting of group 3B (group 13) (e.g., B, Al, Ga, In, etc.) and group 7B (group 17) (e.g., F, Cl, Br, I, etc.) of the periodic table was added as addition elements will be described. By using such addition elements, a film having excellent light-emitting capabilities can be obtained.

Here, the proportion between the Zn in the zinc sulfide compound and the addition element Cu in the light-emitting film according to the present embodiment was investigated by preparing five light-emitting films having varied proportions. At this stage, to form the donor level in the zinc sulfide compound, Ga was added to the light-emitting film so that the proportion of Ga based on the Zn was about 0.1 mol %.

Then, as illustrated in the below Table 1 and in FIG. 4, it was learned that when the added amount of Cu in the light-emitting film was 0.3 mol % or more and 12 mol % or less based on the Zn, the resistivity of the light-emitting film could be set to 0.15 Ωcm or more and 3 Ωcm or less.

Figure 4:
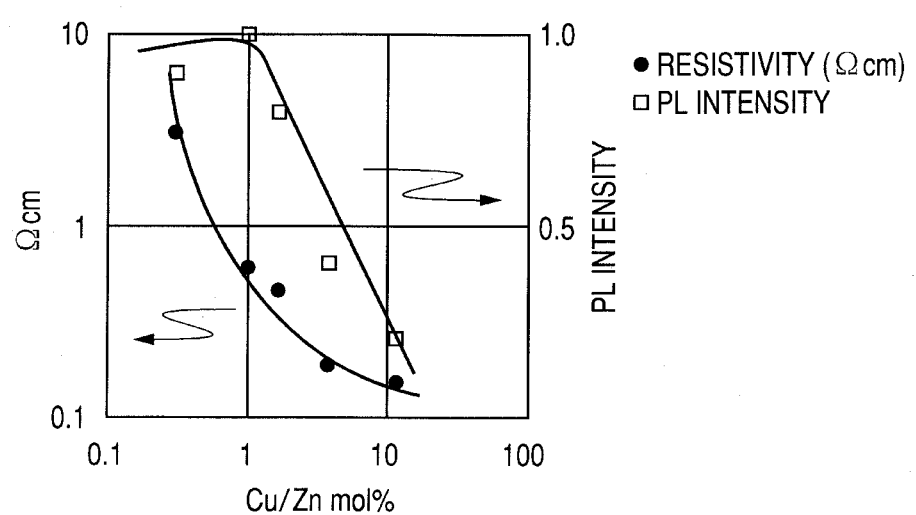
FIG. 4 is a diagram illustrating the relationship among the concentration of Cu, which is an additive of the light-emitting film according to the present invention, resistivity, and PL intensity.

Further, as shown in Table 1 and FIG. 4, it was learned from evaluation of PL (photoluminescence) intensity using ultraviolet rays that PL intensity increases when the added amount of Cu is low and decreases when the added amount of Cu is large. From these results, a light-emitting film can be obtained which combines light-emitting capabilities and a desired resistivity. When forming a light-emitting device using this light-emitting film, the drive voltage of the light-emitting device can especially be decreased by increasing the added amount of Cu, while on the other hand, the emitted luminance of the light-emitting device can especially be increased by decreasing the added amount of Cu. Here, if the added amount of Cu is too low, the resistivity of the light-emitting film becomes too large, so that the drive voltage of the light-emitting device increases. Conversely, if the added amount of Cu is too large, the resistivity of the light-emitting film becomes too small, and a large current flows through the light-emitting device when it is driven, which causes drive stability to deteriorate. In the present embodiment, by suitably controlling the added amount of Cu, a light-emitting film depending on an intended purpose can be provided. In the present embodiment, a suitable range for the added amount of Cu is 0.1 mol % or more and 20 mol % or less based on the Zn. In this case, the resistivity of the light-emitting film is 0.1 Ωcm or more and 10 Ωcm or less.

TABLE 1

|  | Cn/Zn mol % | Resistivity Ωcm | PL intensity relative value |
| --- | --- | --- | --- |
| Light emitting film 1 | 0.31 | 3.02 | 0.9 |
| Light emitting film 2 | 1.02 | 0.611 | 1 |
| Light emitting film 3 | 1.67 | 0.452 | 0.8 |
| Light emitting film 4 | 3.86 | 0.19 | 0.4 |
| Light emitting film 5 | 11.9 | 0.148 | 0.2 |

Next, a light-emitting device having the light-emitting film according to the present embodiment as a constituent element will be described.

Figure 5:
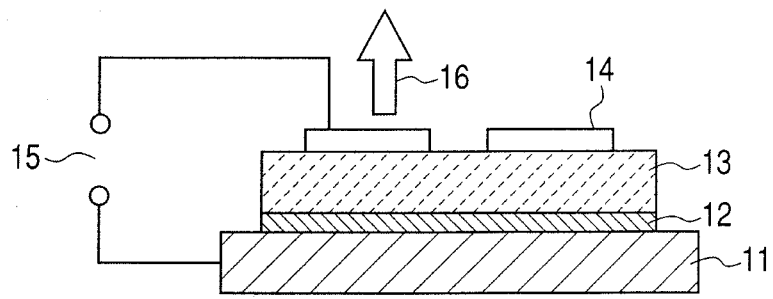
FIG. 5 is a cross-sectional view of the light-emitting device according to the present invention.

The light-emitting film according to the present embodiment can be utilized in a light-emitting device like that illustrated in FIG. 5. The light-emitting device illustrated in FIG. 5 is one example of the present embodiment, and is formed by laminating a film 12 having a greater resistivity than the light-emitting film, the light-emitting film 13 of the present embodiment, and a transparent electrode film 14 on a conductive substrate 11 in that order.

Examples of the film 12 having a greater resistivity than the light-emitting film include $AlO_x$, $AlN_x$, $SiO_x$, and $ZnO_x$. However, for this film to work as a carrier injection layer, the film does not have to be a completely insulating film. It is sufficient for the film to have an anion defect in its constituent elements so that the drive voltage of the light-emitting device can be decreased. Anion defect in the constituent elements of the film can be easily inferred by comparing with the spectrum of a film without a defect using light transmission spectrum measurement. Further, the thickness of the film having a greater resistivity than the light-emitting film is desirably 100 nm or less, as the drive voltage of the device is decreased. In addition, if the film thickness is too small, its continuity as a film may be lost. Thus, the thickness is desirably 5 nm or more.

Next, the differential resistivity in the light-emitting device according to the present embodiment when emitting light and when not emitting light was investigated. Here, the differential resistivity was evaluated using the circuit illustrated in FIG. 7. First, a light-emitting device 41 and a resistor 42 are connected in series to a power source 15. Then, while gradually increasing the voltage of the power source 15, the voltages being applied respectively on the light-emitting device 41 and the resistor 42 are measured using a voltmeter 43. At this point, by setting the resistivity of the resistor 42 to about $1/10$ or more of the resistivity of the light-emitting device, the current value flowing in the circuit can be determined with little error from the value of the voltage being applied on the resistor 42. Further, since the current value flowing in the circuit is the same as the current value flowing in the light-emitting device, the resistivity of the light-emitting device can be determined from this current value and the voltage being applied on the light-emitting device 41.

Specifically, the resistivity is determined as follows. Generally, like a diode for example, differential resistivity (r) is used when defining resistivity during application of an arbitrary voltage in a device having a non-linear relationship between the applied voltage and the current. Letting the differential voltage be dV, and the differential current be dI, the differential resistivity can be expressed by the formula $r=dV/dI$. From this formula, the differential resistivity for when light is not emitted and for when light is emitted can be determined. Here, "when light is emitted" represents the state where the emitted luminance is 1 $cd/m^2$ which can be adequately observed visually, and "when light is not emitted" represents the state where the emitted luminance is $1/10$ that of when light is emitted, which is difficult to evaluate with a general-purpose luminance measuring instrument or to visually observe. Thus, it was learned that the differential resistivity for when light is emitted is desirably $1/1000$ or more and $1/2$ or less the differential resistivity for when light is not emitted, since at such times the drive stability of the light-emitting device is improved. If this value is less than $1/1000$, the device resistance when light is emitted becomes too small, and a large current is flowed which causes the drive stability to deteriorate, while if this vale is more than $1/2$, the number of carriers is too small, which causes luminance to deteriorate.

Figure 6:
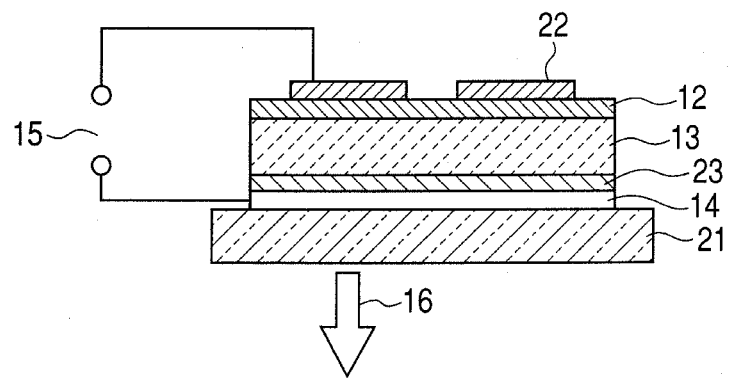
FIG. 6 is a cross-sectional view of the light-emitting device according to the present invention.

The structure of the light-emitting device is not limited to that illustrated in FIG. 5, and may be such that the emission is extracted from the substrate side by using a transparent substrate and a transparent electrode as illustrated in FIG. 6. Further, a structure using a p-type semiconductor film 23 may also be used, which if used increases hole injection properties, whereby luminance is improved.

By having the above-described structure, the light-emitting film according to the present embodiment can combine light-emitting capabilities and a desired resistivity. By using this light-emitting film, a light-emitting device which can be driven at a low voltage with high-luminance can be produced.

Next, a method for producing the light-emitting film according to the present embodiment will be described.

Generally, methods for producing a light-emitting film (sulfide film) such as that of the present invention include multi-source vapor deposition, sulfurization, solid phase deposition, organometal chemical vapor transportation, vapor phase deposition, sputtering, laser ablation and the like. Although sputtering is effective from the standpoint of simplicity, for the production of the light-emitting film according to the present invention which includes an addition element in a zinc sulfide compound, it is more desirable to use multi-source vapor deposition which has advantages in terms of the ability to control the composition and in the deposition rate.

Figure 8:
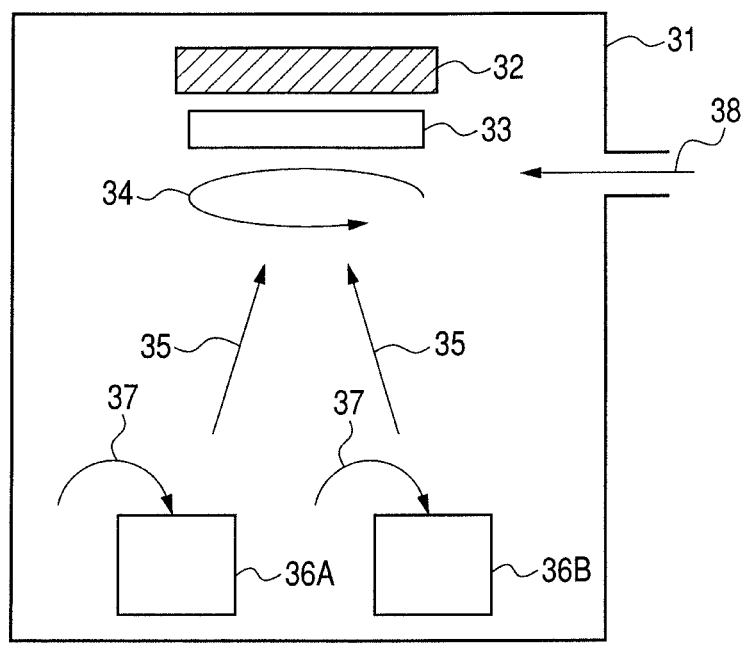
FIG. 8 is a schematic diagram of an electron beam vacuum vapor deposition apparatus.

In the production of the light-emitting film according to the present invention, a multi-source vapor deposition apparatus such as that illustrated in FIG. 8 is used. In the interior of a vacuum chamber 31, material supply sources 36A and 36B are volatilized by an electron beam 37, and are then supplied as materials as indicated by reference numeral 35 to a substrate 33 which is heated by a substrate heater 32. At this stage, the substrate 33 is rotating as indicated by the reference numeral 34. Specifically, Cu metal and a zinc sulfide compound containing one or more elements selected from the group consisting of group 3B (group 13) and group 7B (group 17) of the periodic table are supplied to the substrate at a supply rate (nm/min) having a ratio of 1:1,000 or more and 1:10 or less. By supplying in this manner, a light-emitting film can be produced with a desired Cu added amount. Further, because a high-quality zinc sulfide compound film can be obtained by carrying out the deposition under a hydrogen sulfide atmosphere while keeping the temperature of the substrate to at least 500° C., the vapor deposition atmosphere is desirably a hydrogen sulfide atmosphere formed from a hydrogen sulfide gas supply 38. At this stage, the deposition rate can be controlled over a relatively broad range. By depositing at 100 nm/min or more and 5,000 nm/min or less, a high-quality zinc sulfide compound film can be obtained.

Identification of the material composition of the film can be carried out by X-ray fluorescence analysis, energy dispersive spectroscopy, high-frequency inductive coupling plasma emission spectroscopy and the like. Further, the crystallinity of the film can be determined by X-ray diffraction analysis using CuK α-rays. The electroconductivity of the film can be determined by four-tip probe measurement, hole measurement and the like.

Embodiment 2

A second embodiment of the light-emitting film according to the present invention will now be described.

The light-emitting film according to the present embodiment includes addition elements in a zinc sulfide compound. The zinc sulfide compound includes Cu as a first addition element, a group 2 element or Ir as a second addition element, and Cl as a third addition element. The added amount of the second addition element is less than the added amount of the first addition element. The zinc sulfide compound containing such addition elements is expressed as ZnS:Cu,X,Cl (wherein X denotes a group 2 element or Ir). Thus, by concomitantly containing three addition elements, electroconductivity can be conferred to the zinc sulfide compound, which is inherently an insulating material. Moreover, the donor and acceptor levels necessary for light emission can be efficiently formed in the zinc sulfide compound, which enables a film having blue light-emitting capabilities to be obtained with high efficiency. It is noted that for the chromatic coordinates of the XYZ color coordinate system shown in the JIS Z8110 standard, the peak wavelength region of blue monochromatic light is in the range of 455 to 485 nm. On the other hand, the wavelength region of blue emission in the present invention is defined as a region having a spectrum in the range of approximately 380 to 500 nm, which includes the peak wavelength of blue monochromatic light.

Examples of the elements represented above by X may include combinations of two or more addition elements arbitrarily selected from group 2 elements and Ir, such as Ba and Mg, Ba and Ir, and Ba and Mg and Ir.

By using Cu as the donor and Cl as the acceptor, and including a group 2 element or Ir, the donor and acceptor levels can be efficiently introduced into the zinc sulfide compound, whereby high-luminance blue emission can be obtained with excellent color purity. When adding the a group 2 element or Ir, by adding these as a chloride which has a lower melting point than the zinc sulfide compound, the crystallinity of the zinc sulfide compound which is the base material is improved due to fusing agent effects. Examples of such chlorides include magnesium chloride $MgCl_2$ (melting point 712° C.), calcium chloride $CaCl_2$ (melting point 772° C.), strontium chloride $SrCl_2$ (melting point 873° C.), barium chloride $BaCl_2$ (melting point 963° C.), and iridium chloride $IrCl_2$ (melting point 763° C.). Further, it is also thought that the respective addition elements are more easily incorporated into the zinc sulfide compound as donors and acceptors, which is desirable.

Like the light-emitting film according to the first embodiment, the light-emitting film according to the present embodiment also has columnar ZnS crystals and sites formed of copper sulfide on a grain boundary where the ZnS crystals are in contact with each other (see FIGS. 1 and 2).

Specifically, if the light-emitting film according to the present embodiment is observed using a scanning electron microscope (SEM), columnar crystals of the zinc sulfide compound of about 50 nm to 200 nm can be seen, and it is understood that the light-emitting film is formed of polycrystalline film. It is desirable to produce the light-emitting device using a polycrystalline light-emitting film, because there is less surface unevenness and uniform light emission can be obtained.

Further, production of a blue light-emitting film which includes an addition element in the zinc sulfide compound was investigated by the following deposition method using a zinc sulfide compound containing for the material supply sources Cu metal and a chloride of a group 2 element or Ir, by varying the ratio between the respective material supply rates (nm/min). Those results are shown in Table 2.

TABLE 2

|  | Cn/Zn mol % | Cl/Zn mol % | X/Zn mol % | Resistivity Ωcm | PL intensity relative value |
|---|---|---|---|---|---|
| Light emitting film 1 | 0.78 | 0.15 | 0.15 | 1.1 | 0.8 |
| Light emitting film 2 | 1 | 0.11 | 0.13 | 0.8 | 0.9 |
| Light emitting film 3 | 3.5 | 0.14 | 0.15 | 0.21 | 1 |
| Light emitting film 4 | 10 | 0.095 | 0.1 | 0.15 | 0.5 |
| Light emitting film 5 | 19 | 0.1 | 0.12 | 0.13 | 0.2 |

As shown in Table 2, by varying the Cu in the blue light-emitting film between 0.78 to 19 mol % based on the Zn, the resistivity of the blue light-emitting film can be varied between 0.13 to 1.1 Ωcm. Further, evaluation of PL (photoluminescence) intensity using ultraviolet rays showed that while the PL intensity is sufficiently large when the added amount of Cu is more than 1.0 mol % and 10 mol % or less, when the added amount of Cu is more than 10 mol %, PL intensity tends to decrease.

Based on these results, to obtain a light-emitting film which combines light-emitting capabilities and a desired resistivity, it is desirable to contain the Cu in a proportion based on the Zn of more than 1.0 mol % and 10 mol % or less. At such point, the resistivity of the light-emitting film is in the range of 0.15 Ωcm or more and 0.8 Ωcm or less.

When using this light-emitting film to form a light-emitting device, if the added amount of Cu is large, drive voltage can especially be decreased, while if the added amount of Cu is low, emitted luminance can especially be improved. Thus, the light-emitting device can be used differently depending on the intended purpose.

Here, the concentrations of X and Cl are not especially limited. For example, the added concentration of Cl in the light-emitting film based on the Zn is 0.01 mol % or more and 1.0 mol % or less, and is desirably about 0.1 mol %. Further, the added concentration of the a group 2 element or Ir in the light-emitting film based on the Zn is 0.01 mol % or more and 1.0 mol % or less, and is desirably about 0.1 mol %.

Next, an embodiment of the light-emitting device according to the present invention will be described.

FIG. 5 is a cross-sectional view illustrating the schematic structure of the light-emitting device as one embodiment of the present invention. A film 12 having a greater resistivity than the light-emitting film, a light-emitting film 13, and a transparent electrode film 14 are stacked in layers on a conductive substrate 11 in that order.

Here, if the added amount of Cu in the light-emitting film 13 is too low, the resistivity of the light-emitting film 13 becomes too large, so that the drive voltage of the light-emitting device increases. Conversely, if the added amount of Cu is too large, the resistivity of the light-emitting film 13 becomes too small, and a large current flows through the light-emitting device when it is driven, which causes drive stability to deteriorate.

Examples of the film 12 having a greater resistivity than the light-emitting film include $AlO_x$, $AlN_x$, $SiO_x$, $ZnO_x$, $TaO_x$, and $YO_x$. However, for this film to work as a carrier injection layer, the film does not have to be a completely insulating film. It is sufficient for the film to have an anion defect in its constituent elements so that, the drive voltage of the light-emitting device can be decreased. To more easily infer that there is an anion defect in the constituent elements of the film, a comparison may be made with the spectrum of a film without a defect using light transmission spectrum measurement. Further, the thickness of the film 12 having a greater resistivity than the light-emitting film is desirably 100 nm or less, as the drive voltage of the device is decreased.

Further, the resistivity of the film 12 having a greater resistivity than the light-emitting film is, in the case of $AlO_x$ for example, about $10^7$ to $10^9$ Ωcm, which is a resistivity sufficiently larger than the light-emitting film 13.

Figure 7:
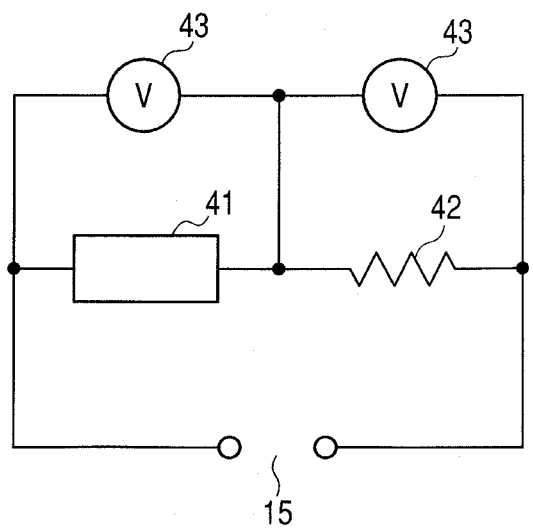
FIG. 7 is a circuit diagram used in the evaluation of differential resistivity used in the present invention.

Further, the differential resistivity of the light-emitting device according to the present embodiment when emitting light and when not emitting light can be evaluated using the circuit illustrated in FIG. 7. A light-emitting device 41 and a resistor 42 are connected in series to a power source 15. Then, while gradually increasing the voltage of the power source 15, the voltages being applied respectively on the light-emitting device 41 and the resistor 42 are measured by connecting to a voltmeter 43. At this point, by selecting the resistivity of the resistor 42 to about 1/10 of the resistivity of the light-emitting device, the current value flowing in the circuit can be determined with little error from the value of the voltage being applied on the resistor 42. Further, since the current value flowing in the circuit is the same as the current value flowing in the light-emitting device, the resistivity of the light-emitting device can be determined from this current value and the voltage being applied on the light-emitting device 41.

Generally, like a diode for example, differential resistivity (r) is used when defining resistivity during application of an arbitrary voltage for a device having a non-linear relationship between the applied voltage and the current. Letting the differential voltage be dV, and the differential current be dI, the differential resistivity can be expressed by the formula $r=dV/dI$. If the differential resistivity for when light is not emitted and for when light is emitted is determined in this manner, the differential resistivity for when light is emitted is desirably 1/1000 or more and 1/2 or less the differential resistivity for when light is not emitted, since at such times the drive stability of the light-emitting device is improved. If this value is less than 1/1000, the device resistance when light is emitted becomes too small, and a large current is flowed which causes the drive stability to deteriorate, while if this vale is more than 1/2, the number of injected carriers is too small, which causes luminance to deteriorate. Here, "when light is emitted" represents the state where the emitted luminance is 1 $cd/m^2$ which can be adequately observed visually, and "when light is not emitted" represents the state where the emitted luminance is 1/10 that for when light is emitted, which is difficult to evaluate with a general-purpose luminance measuring instrument or to visually observe.

The structure of the light-emitting device may be, as illustrated in FIG. 6, such that the emission is extracted from the substrate side by using a transparent substrate 21 and a transparent electrode film 14. Specifically, this structure is formed by laminating a transparent electrode film 14, the above-described light-emitting film 13, a film 12 having a greater resistivity than the light-emitting film, and an electrode film 22 on a transparent substrate in that order. Further, as illustrated in FIG. 6, a structure in which a p-type semiconductor film 23 is used in between the transparent electrode film 14 and the light-emitting film 13 may also be used. Such a structure is desirable because it has improved hole injection properties, whereby the luminance can be improved. To improve hole injection properties, $V_2O_5$, $WO_3$, $MoO_3$ and the like which are used for organic EL devices may be used. Especially, p-type oxides such as calcopyrite compounds, stannite compounds, delafossite compounds, $NiO:Li, Cu_2O$, which are p-type semiconductor films, may be used.

Next, a method for producing the light-emitting film according to the present embodiment will be described.

Methods for producing the light-emitting film of the present embodiment include multi-source vapor deposition, sulfurization, solid phase deposition, organometal chemical vapor transportation, vapor phase deposition, sputtering, laser ablation and the like. Although sputtering is effective in terms of simplicity, for the production of the light-emitting film of the present invention which includes an addition element in a zinc sulfide compound, it is more desirable to use multi-source vapor deposition which has advantages in terms of the ability to control the composition and in the deposition rate.

A light-emitting film having a desired Cu added amount can be produced by using Cu metal and a zinc sulfide compound including a chloride of a group 2 element or Ir for the material supply sources of the light-emitting film, and setting the ratio between the supply rates to the substrate to between 1:1000 or more and 1:10 or less. Further, by carrying out the deposition in a hydrogen sulfide atmosphere at a substrate temperature of 500° C. or more and less than 1,000° C., a high-quality zinc sulfide compound film can be obtained which has excellent crystallinity and has light-emitting capabilities. If the substrate temperature is less than 500° C., crystallinity deteriorates, and the light-emitting capabilities also cannot be obtained, which is not desirable. Further, if the substrate temperature is 1,000° C. or more, unevenness on the surface of the light-emitting film becomes more marked, so that production of the light-emitting device becomes more difficult, which is not desirable.

In the production of the light-emitting film according to the present embodiment, a multi-source vapor deposition apparatus such as that illustrated in FIG. 8 is used. In the interior of a vacuum chamber 31, material supply sources 36A and 36B are volatilized by an electron beam 37, and are supplied (see reference numeral 35) to a substrate 33 which is heated by a substrate heater 32. The vapor deposition atmosphere may be a hydrogen sulfide atmosphere formed from a hydrogen sulfide gas supply 38. The substrate 33 is rotating as indicated by the reference numeral 34.

Further, the deposition rate can be controlled in a relatively broad range. By depositing at between 100 nm/min or more and 5,000 nm/min or less, a high-quality zinc sulfide compound can be obtained.

Generally, for the material supply sources used in multi-source vapor deposition, a powder is molded by packing with a press or the like, and the resultant powder is then crystallized by calcining to form a source having an increased sintered density. However, the chlorine contained in the zinc sulfide compound, including a chloride of a group 2 element or Ir, used in the present invention is chemically unstable. Thus, the chlorine tends to turn into an oxide as a result of oxidation from the oxygen or moisture in the air, or the chlorine tends to escape due to prolonged heat treatment. Therefore, the production method of the present embodiment includes, prior to the deposition process, the process of rapidly heating the zinc sulfide compound which contains a chloride of a group 2 element or Ir in a deposition apparatus kept in a vacuum, and the process of then rapidly cooling the zinc sulfide compound. By heat treating in a vacuum, calcining can be carried out while preventing the zinc sulfide compound and contained chloride from reacting with the oxygen and moisture in the air. Further, by rapidly heating and rapidly cooling, the calcining can be completed while shortening the time in which chlorine escapes as much as possible, and the light-emitting film can be formed as is without bringing out into the air.

While the heating temperature in the rapid heating process depends on the kind of material supply source, a heating temperature of 100° C./min or more and 1,000° C./min or less is desirable. If the heating temperature is less than 100° C./min, the chlorine escaping from the material supply source increases, which is not desirable. On the other hand, if the heating temperature is more than 1,000° C./min, residual gases in the material supply source are released all at once, and the material may scatter in the deposition apparatus, which is not desirable. Further, while the cooling temperature in the rapid cooling process depends on the kind of material supply source, a cooling temperature of 500° C./min or more is desirable. If the cooling temperature is less than 500° C./min, the chlorine escaping from the material supply source increases, and the crystallization and sintered density may be insufficient, which is not desirable. The temperature of the material supply sources can be measured using a radiation thermometer or the like through the window of a view port of the deposition apparatus. For the view port window, a material which is pervious to infrared radiation such as barium fluoride may preferably be used.

Identification of the material composition of the film can be carried out by X-ray fluorescence analysis, energy dispersive spectroscopy, high-frequency inductive coupling plasma emission spectroscopy and the like. The crystallinity of the film can be determined by X-ray diffraction analysis using CuK α-rays. The electroconductivity of the film can be determined by four-tip probe measurement, hole measurement and the like.

According to the present embodiment, a light-emitting film can be obtained which combines light-emitting capabilities and a desired resistivity. Further, by laminating a light-emitting film and a film having a greater resistivity than the light-emitting film or a p-type semiconductor film, a light-emitting device can be obtained which exhibits high-luminance emission at a low voltage drive. In addition, according to the production method of the present invention, a light-emitting device can be efficiently produced by a simpler method.

EXAMPLES

The present invention will now be further described using examples. However, the present invention is not limited to the following examples.

Example 1

In the present example, the light-emitting film according to the present invention which includes an addition element in a zinc sulfide compound is produced.

First, a light-emitting film is deposited on an Si or a quartz substrate using the electron beam vacuum vapor deposition apparatus illustrated in FIG. 8. Here, the material supply sources are Cu metal and a zinc sulfide compound containing 0.1 mol % of Ga based on the Zn. Then, Cu and the zinc sulfide compound are deposited to a film thickness of 1,000 nm at a material supply rate of, respectively, 12 nm/min and 600 nm/min under a hydrogen sulfide atmosphere at a pressure of $1 \times 10^{-3}$ Pa while keeping the substrate temperature at 600° C. X-ray fluorescence analysis of the composition of the obtained light-emitting film showed that Cu/Zn was 3.86 mol % and Ga/Zn was 0.09 mol %. Further, in X-ray diffraction analysis using CuK α-rays, main peaks could be seen in the vicinity of $2\theta=28.7°$, 33.1°, 47.7°, and 56.6°, thus showing that the light-emitting film was a polycrystalline film having a good zinc blende structure. Further, when the light-emitting film was irradiated with 312 nm ultraviolet rays using an ultraviolet ray lamp, green light having a center wavelength of 530 nm was emitted. In addition, the electroconductivity of the light-emitting film on the quartz substrate was measured by a four-tip probe measuring device to be 0.19 Ωcm.

Example 2

In the present example, the light-emitting film according to the present invention which includes an addition element in a zinc sulfide compound is produced.

First, a light-emitting film is deposited on an Si or a quartz substrate using the electron beam vacuum vapor deposition apparatus illustrated in FIG. 8. Here, the material supply sources are Cu metal and a zinc sulfide compound containing 0.1 mol % of Ga based on the Zn. Then, while keeping the substrate temperature at 600° C., deposition was carried out under a hydrogen sulfide atmosphere at a pressure of $1 \times 10^{-3}$ Pa. At this stage, the Cu material supply rate (nm/min) was selected within 0.6 to 60 nm/min, and the zinc sulfide compound material supply rate was fixed at 600 nm/min. By varying the Cu material supply rate in this manner, light-emitting films 1 to 5 were produced having different added amounts of Cu. The composition of these light-emitting films was subjected to X-ray fluorescence analysis and their electroconductivity was measured by a four-tip probe measuring device. The results shown in the above Table 1 and FIG. 4 were obtained. From these results it was learned that if the added amount of Cu in a light-emitting film is 0.31 mol % or more and 11.9 mol % or less based on the Zn, which is large, the resistivity of the light-emitting film decreases to 0.148 Ωcm or more and 3.02 Ωcm or less. Further, as shown in Table 1 and FIG. 4, it was learned from evaluation of PL (photoluminescence) intensity using ultraviolet rays that PL intensity increases when the added amount of Cu is low and decreases when the added amount of Cu is large. Specifically, by controlling the added amount of Cu in the range of 0.31 mol % or more to 11.9 mol % or less based on the Zn, a light-emitting film can be obtained which combines excellent light-emitting capabilities and a desired resistivity.

Example 3

In the present example, a light-emitting film according to the present invention including an addition element in the zinc sulfide compound was produced. The structure of this light-emitting film was analyzed in detail.

First, a light-emitting film was deposited on a quartz substrate using an electron beam vacuum vapor deposition apparatus with Cu metal and a zinc sulfide compound containing 0.1 mol % of Ga based on the Zn as the supply sources. At this stage, the deposition was carried out to a film thickness of 1,000 nm under a hydrogen sulfide atmosphere, at a pressure of $1 \times 10^{-2}$ Pa, a Cu metal material supply rate of 10 nm/min, and a zinc sulfide compound material supply rate of 600 nm/min while keeping the substrate temperature at 600° C. X-ray fluorescence analysis of the composition of the obtained light-emitting film showed that Cu/Zn was 3.1 mol % and Ga/Zn was 0.10 mol %.

Figure 9:
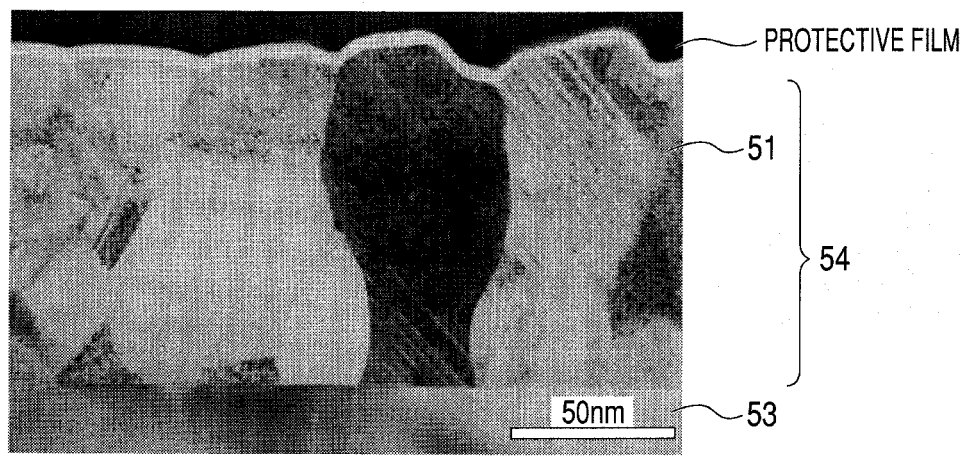
FIG. 9 is a cross-sectional TEM image of the light-emitting film according to the present invention.
Figure 10:
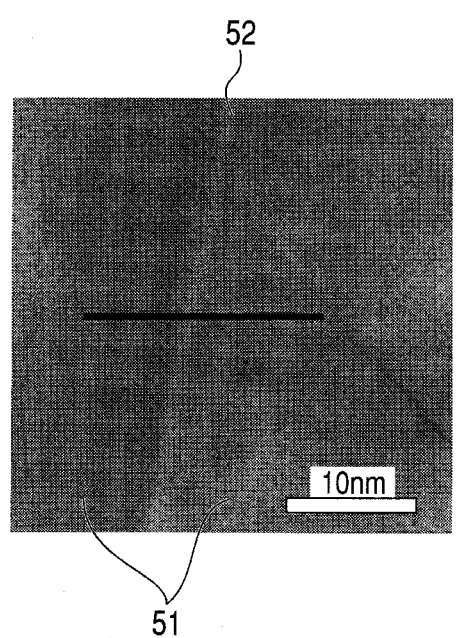
FIG. 10 is a TEM image of the grain boundary formed by ZnS crystals of the light-emitting film according to the present invention.
Figure 11:
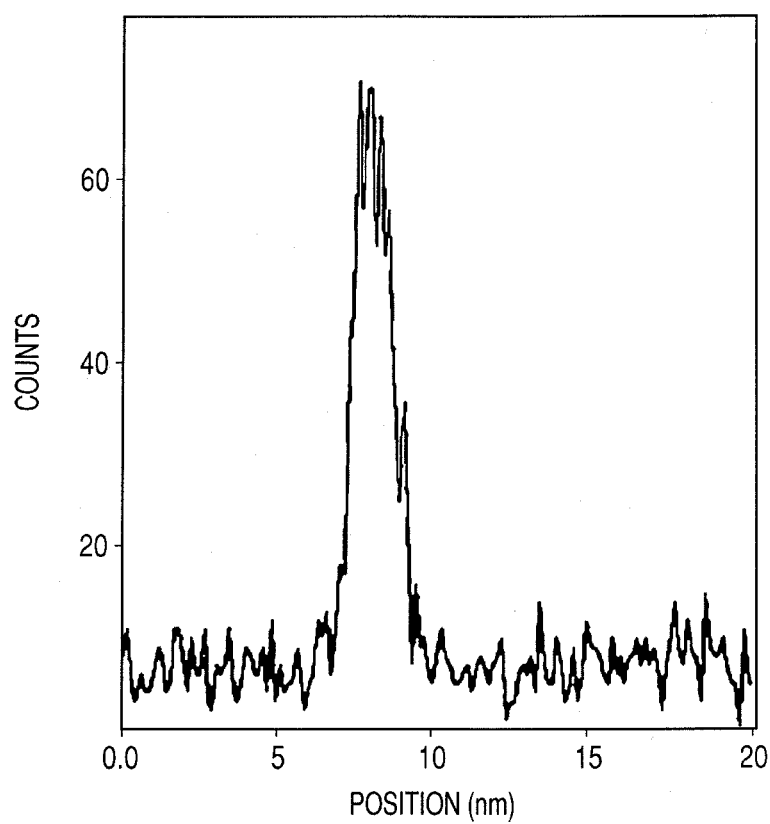
FIG. 11 illustrates the results of a line scan from a composition analysis of the Cu amount in the region indicated by the black line of FIG. 10.

FIG. 9 illustrates the observation results of the cross-section of the produced light-emitting film using a transmission electron microscope (TEM). ZnS crystals 11 had a columnar structure with a diameter of 300 to 500 nm grown perpendicularly from the substrate 53. FIGS. 1 and 2 illustrate schematic views thereof. High resolution TEM (HRTEM) analysis showed that each ZnS crystal had a structure containing a large amount of stacking fault of hexagonal crystal wurtzite and cubic crystal zinc blende structures. FIG. 10 illustrates an HRTEM image of the grain boundary where ZnS crystals are in contact with each other. Segregated matter about 3 nm in thickness was observed on the grain boundary. FIG. 11 illustrates the results of a line scan from a composition analysis by energy dispersive X-ray analysis (EDX) in the range of 20 nm of the black line of FIG. 10. A large amount of Cu deposition was verified in the region about 3 nm from the grain boundary. While in this region the amount of Zn was substantially lower than that in the ZnS crystals, the amount of S was largely unchanged. It can thus be considered that $Cu_xS$ formed of Cu and S was deposited. Further, EDX composition analysis carried out at the boundary between the ZnS crystals and the substrate showed that Cu scarcely deposited, and that the deposited amount of Cu was ⅓₀ or less that of the deposited amount on the grain boundary between ZnS crystals. From these EDX results, it was learned that $Cu_xS$ was deposited only on the grain boundary between ZnS crystals.

Figure 12:
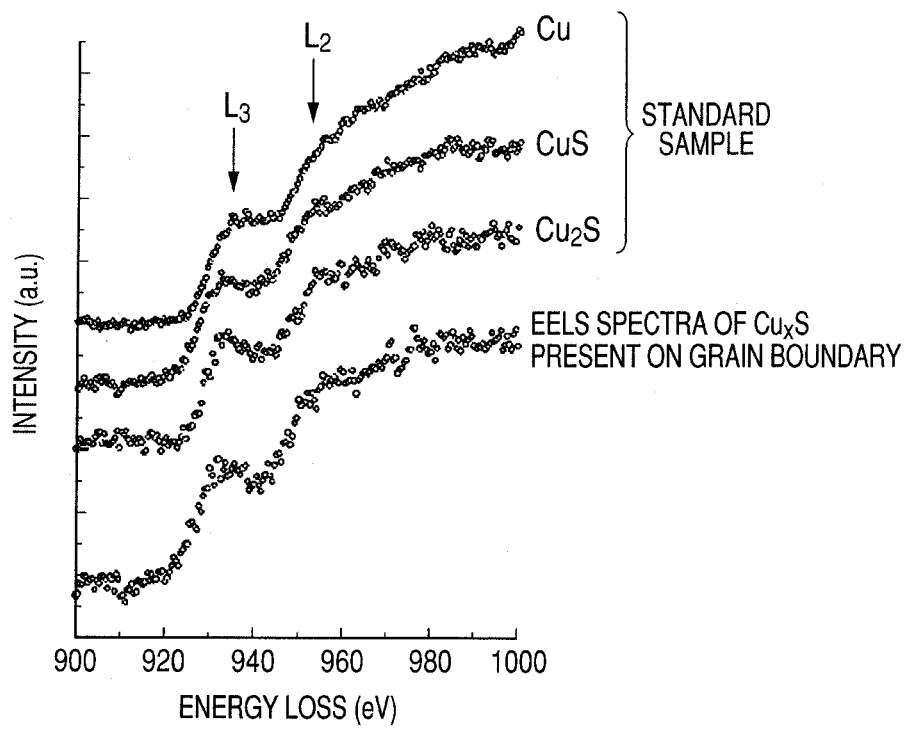
FIG. 12 illustrates the EELS spectrum of the $Cu_xS$ present on the grain boundary of the light-emitting film according to the present invention and the EELS spectra of standard samples of Cu, CuS, and $Cu_2S$ as comparative examples.

The thickness of this $Cu_xS$ is not constant throughout the light-emitting film. The $Cu_xS$ thickness is thinner or thicker within the range of 3 nm or less range depending on the region. As illustrated in FIG. 3, there are regions which are narrow like a needle, and regions which seem to discontinue midway along. Since the $Cu_xS$ is deposited in tiny regions with a grain boundary of about several nm, it is difficult with EDX to quantify the Cu and the S, and thus the value of x in $Cu_xS$ cannot be defined. Therefore, the EELS spectrum of the L2 and 3 ends of the Cu at the grain boundary is measured by electron energy loss spectroscopy (EELS), and the Cu bonding state is evaluated by comparing with the EELS spectra of Cu, CuS, and $Cu_2S$ measured as standard samples to define the value of x in $Cu_xS$. FIG. 12 illustrates the EELS spectrum of $Cu_xS$ at the grain boundary, and the standard sample EELS spectra of Cu, CuS, and $Cu_2S$ measured as comparative examples. In FIG. 12, the intensities are offset from each other so that the comparison between each of the spectra can be easily understood. The peak in the vicinity of an energy loss of 930 eV is the L2 end, and the peak in the vicinity of 950 eV is the L3 end. The L2 and L3 ends are respectively the transitions of Cu electrons from 2p1/2 to 3d and 2p3/2 to 3d. These peaks indicate that the Cu 3d orbital is not completely filled. From the measured results of the standard sample Cu, CuS, and $Cu_2S$ EELS spectra, there was a difference between the shapes of the EELS spectra of the L2 and 3 ends for the metal Cu and the semiconductor $Cu_xS$. Specifically, since metal Cu has a completely filled 3d orbital, no peaks are indicated at the L2 and 3 ends. In contrast, it was learned that since CuS and $Cu_2S$ are both semiconductors, as x increases, openings are formed in the 3d orbital, so that peaks are indicated at the L2 and 3 ends. Since the EELS spectrum at the grain boundary $Cu_xS$ of the present invention indicated L2 and 3 peaks, the $Cu_xS$ can be considered as not being in a metal Cu state. Here, to define the range of x in $Cu_xS$, the following was carried out. First, the value of the intensity at an energy loss of 940 eV was taken as a background. Then, the L2 end peak magnitude was evaluated and compared by finding the ratio R with the value of the intensity at the peak position at an energy loss of 930 eV. Here, R=(intensity at 930 eV/intensity at 940 eV). The standard sample Cu has an R of 1, CuS has an R of 1.12, and $Cu_2S$ has an R of 1.23, so that the value of R increased as the value of x in $Cu_xS$ increased. Here, for $Cu_xS$ at the grain boundary of the present invention illustrated in FIG. 12, R was 1.21. Further, measuring the EELS spectrum of the grain boundary 5 times while varying the position of the sample gave values for R of 1.23, 1.19, 1.23, 1.18, and 1.21. Comparing these results with the R values of the standard samples, it can be thought that the value of x in the grain boundary $Cu_xS$ of the present invention is larger than CuS with x=1, and is in a range of $1<x\leq2$ including $Cu_2S$ with x=2. Examples of $Cu_xS$ which can stably exist with this range for x include $Cu_{1.75}S$ (x=1.75), $Cu_{1.8}S$ (x=1.8), $Cu_{1.96}S$ (x=1.96), and $Cu_2S$ (x=2). Therefore, the composition of the sites formed of copper sulfide ($Cu_xS$) of the grain boundary of the present invention can be thought to have an x value in the range of 1.75 to 2 ($1.75\leq x\leq2$). From the above HRTEM, EDX, and EELS results, it can be seen that the light-emitting film according to the present example is formed of columnar ZnS crystals, and has a structure having sites formed of copper sulfide represented by $Cu_xS$ on the grain boundary where ZnS crystals are in contact with each other. The thickness d of the $Cu_xS$ is 3 nm or less, and the $Cu_xS$ is formed in the light-emitting film so as to cover the ZnS columnar crystals. Further, in the $Cu_xS$, the value of this x is in the range of 1.75 or more to 2 or less.

The resistivity of the produced light-emitting film was measured by a four-tip probe measuring device to be 0.35 Ωcm. Further, emission from a 312 nm ultraviolet lamp was observed as green light having a peak of 530 mm.

Comparative Example 1

In the present comparative example, a sample without $Cu_xS$ deposition on the grain boundary was produced by adjusting the supply rate of the raw material Cu metal during deposition.

The sample without $Cu_xS$ deposition on the grain boundary was produced by reducing the added amount of Cu using a material supply rate of the Cu metal during deposition of 0.5 nm/min, which is ¹⁄₂₀ that of Example 3. The resistivity of the produced sample was higher at 3.30 Ωcm. Further, the emission from ultraviolet ray lamp excitation was darker than that of the present examples. Deposition of $Cu_xS$ on the grain boundary was not verified from TEM analysis.

Comparative Example 2

In the present comparative example, a sample with metal Cu deposition on the grain boundary was produced by adjusting the supply rate of the raw material Cu metal during deposition.

The sample with metal Cu deposition on the grain boundary was produced by increasing the added amount of Cu using a material supply rate of the Cu metal during deposition of 50 nm/min, which is 5 times that of Example 3. The resistivity of the produced sample was lower at 0.15 Ωcm. Further, the emission from ultraviolet ray lamp excitation was darker than that of the present examples. Deposition of metal Cu on the grain boundary was verified from TEM analysis.

From Comparative Examples 1 and 2, it was learned that if the added amount of Cu is too low, $Cu_xS$ which acts as a current pathway is not deposited on the grain boundary, whereby it is thought that the resistivity of the light-emitting film increases. As a result, the drive voltage when used as a light-emitting device increases. On the other hand, it was learned that if the added amount of Cu is too high, metal Cu is deposited on the grain boundary, whereby it is thought that the resistivity of the light-emitting film decreases. As a result, when used as a light-emitting device a large current flows through the light-emitting device when it is driven, which causes drive stability to deteriorate. Further, in neither case were the effects of electric field concentration resulting from the deposition of $Cu_xS$ obtained, whereby it is thought that the light-emitting intensity decreases. Therefore, a light-emitting film can be obtained which combines light-emitting capabilities and a desired resistivity by suitably controlling the Cu content so that the light-emitting film has sites formed of copper sulfide ($Cu_xS$) on the ZnS columnar crystal grain boundary of the examples as described above.

Example 4

In the present example, a light-emitting device using the light-emitting film according to the present invention which includes an addition element in the zinc sulfide compound is produced.

Figure 13:
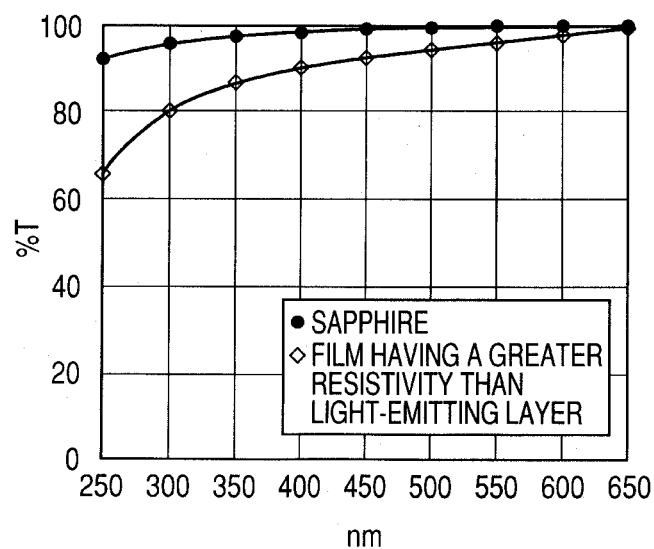
FIG. 13 is a diagram illustrating the light transmission spectrum of a film having a greater resistivity than the light-emitting film according to the present invention.

First, as illustrated in FIG. 5, a film 12 having a greater resistivity than the light-emitting film was deposited on a low-resistance Si substrate, a conductive substrate 11, using an electron beam vacuum vapor deposition apparatus. Specifically, with $Al_2O_3$ as the material supply source, deposition was carried out to a film thickness of 20 nm at a pressure of $1\times10^{-3}$ Pa and a material supply rate of 12 nm/min while keeping the substrate temperature at 200° C. At this stage, deposition was carried out on a quartz substrate under identical conditions. As illustrated in FIG. 13, from measurement of the light transmission spectrum of the film having a greater resistivity than the light-emitting film, a gentle light absorption could be seen in the wavelength region of 500 nm or less, where absorption would not be seen for a completely $Al_2O_3$ (sapphire) film. Thus, it is inferred that the film had a pale brown color, and had an oxygen defect.

Next, the light-emitting film 13 was deposited on the film 12 having a greater resistivity than the light-emitting film using the electron beam vacuum vapor deposition apparatus. Specifically, with Cu metal and a zinc sulfide compound containing 0.1 mol % of Ga based on the Zn as the material supply sources, deposition was carried out to a film thickness of 300 nm under a hydrogen sulfide atmosphere and at a pressure of $1\times10^{-3}$ Pa while keeping the substrate temperature at 600° C. At this stage, the material supply rate for Cu was set to 9 nm/min and that for the zinc sulfide compound was set to 600 nm/min. X-ray fluorescence analysis of the composition of the obtained light-emitting film showed that Cu/Zn was 2.17 mol % and Ga was below the limits of detection. In addition, the electroconductivity was measured by a four-tip probe measuring device to be 0.25 Ωcm.

Further, a transparent electrode film 14 was deposited to a film thickness of 400 nm on the light-emitting film 13 under a pressure of 1 Pa at a deposition rate of 10 nm/min while flowing argon gas using a magnetron sputtering apparatus with ITO ($SnO_2$=5 wt %) used as a target.

When voltage was applied to the thus-produced light-emitting device between the conductive substrate 11 and the transparent electrode film 14 using a power source 15, green light which gradually became brighter was emitted at about 15 V.

Further, using the light-emitting films of Example 2, various light-emitting devices were produced having the same structure as that described above. Evaluation of these devices showed that when the added amount of Cu was large, drive voltage could especially be reduced, while when the added amount of Cu was low, the emitted luminance could especially be improved.

Example 5

In the present example, a light-emitting device using the light-emitting film according to the present invention which includes an addition element in the zinc sulfide compound is produced.

First, as illustrated in FIG. 6, a transparent electrode film 14 was deposited on a quartz substrate which is a transparent substrate 21 using a magnetron sputtering apparatus. Specifically, deposition was carried out to a film thickness of 300 nm under a pressure of 1 Pa at a deposition rate of 10 nm/min while flowing argon gas using an ITO ($SnO_2$=5 wt %) target.

Next, $Cu_2ZnGe_xSi_{1-x}S_4$ as a p-type semiconductor film 23 was deposited on the transparent electrode film 14 using an electron beam vacuum vapor deposition apparatus. Specifically, with Cu metal, and ZnS:Ge,Si (Zn:Ge:Si mole ratio=1:0.6:0.4) as the material supply sources, deposition was carried out to a film thickness of 100 nm at a pressure of $2\times10^{-2}$ Pa while keeping the substrate temperature at 500° C. and while flowing hydrogen sulfide gas. At this stage, the deposition rate was set for Cu to 21 nm/min, and ZnS:Ge, Si to 84 nm/min.

Next, a light-emitting film 13 was deposited on the p-type semiconductor film 23 using the electron beam vacuum vapor deposition apparatus. Specifically, with Cu metal and a zinc sulfide compound containing 0.1 mol % of Ga based on the Zn as the material supply sources, deposition was carried out to a film thickness of 200 nm under a hydrogen sulfide atmosphere and at a pressure of $1\times10^{-3}$ Pa while keeping the substrate temperature at 600° C. At this stage, the material supply rate for Cu was set to 12 nm/min and that for the zinc sulfide compound was set to 600 nm/min.

Next, a film 12 having a greater resistivity than the light-emitting film was deposited on the light-emitting film 13 to a film thickness of 100 nm under a pressure of 1 Pa at a deposition rate of 3 nm/min while flowing argon gas and using an AlN target and a magnetron sputtering apparatus.

Next, an electrode film 22 was deposited on the film 12 having a greater resistivity than the light-emitting film to a film thickness of 80 nm under a pressure of $5\times10^{-4}$ Pa at a deposition rate of 30 nm/min with Al metal as a material supply source using the electron beam vacuum vapor deposition apparatus.

When voltage was applied to the thus-produced light-emitting device between the electrode film 22 and the transparent electrode film 14 using a power source 15, green light which gradually became brighter was emitted at about 15 V.

Example 6

In the present example, a light-emitting device was produced using the light-emitting film according to the present invention including an addition element in a zinc sulfide compound having sites formed of copper sulfide on the ZnS crystal grain boundary of the present invention. The structure of this light-emitting device was analyzed in detail.

Figure 14:
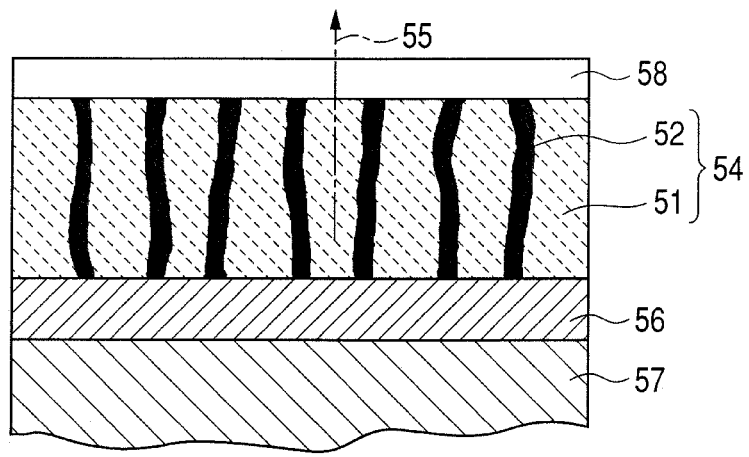
FIG. 14 is a schematic diagram illustrating a cross-sectional view of the light-emitting device according to the present invention.

As illustrated in FIG. 14, $Al_2O_3$ as a high-resistance film 56 was deposited on a low-resistance Si substrate as the conductive substrate 57 to a film thickness of 20 nm at a pressure of $1\times10^{-3}$ Pa and a material supply rate of 12 nm/min while keeping the substrate temperature at 200° C. Next, as the light-emitting film 54, a ZnS light-emitting film 54 was deposited on a quartz substrate using an electron beam vacuum vapor deposition apparatus with Cu metal and a zinc sulfide compound containing 0.1 mol % of Ga based on the Zn as the supply sources. The deposition was carried out to a film thickness of 500 nm under a hydrogen sulfide atmosphere, at a pressure of $1\times10^{-3}$ Pa, a substrate temperature kept at 600° C., a Cu metal material supply rate of 10 nm/min, and a zinc sulfide compound material supply rate of 600 nm/min. X-ray fluorescence analysis of the composition of the obtained light-emitting film showed that Cu/Zn was 3.0 mol % and Ga/Zn was 0.10 mol %. In addition, electroconductivity was measured by a four-tip probe measuring device to be 0.32 Ωcm. Finally, ITO as a transparent electrode 58 was deposited to 400 nm on the light-emitting film 54 using a magnetron sputtering apparatus to produce a light-emitting device.

Next, analysis of the produced light-emitting device using TEM, EDX, and EELS in the same manner as in Example 3 showed that, as illustrated in FIG. 14, the light-emitting film 54 was formed by ZnS crystals 51 with a diameter of 300 to 500 nm grown perpendicularly. The ZnS crystals 51 had a structure containing hexagonal crystal wurtzite and a large amount of stacking fault hexagonal crystal zinc blende structures. At the grain boundary where ZnS crystals are in contact with each other, a deposit of $Cu_xS$ 52 could be seen in the region having a thickness of 3 nm or less. From EELS evaluation, the $Cu_xS$ 52 at the grain boundary had a composition close to $Cu_2S$ with x=2. There was very little $Cu_xS$ 52 deposited at the boundary between the ZnS crystals 51 and the high-resistance film 56, or at the boundary between the ZnS crystals 51 and the transparent electrode 58. The deposited amount was 1/30 or less that of the deposited amount at the grain boundary between ZnS crystals 51. When voltage was applied to the produced light-emitting device between the conductive substrate 57 and the transparent electrode 58, green light which gradually became brighter was emitted at about 15 V.

Example 7

In the present example, the light-emitting film which includes an addition element in a zinc sulfide compound is produced. Here, a light-emitting film is deposited on an Si or a quartz substrate using the electron beam vacuum vapor deposition apparatus illustrated in FIG. 8.

First, Cu metal (36A) and a zinc sulfide compound (36B) containing 0.1 mol % of $MgCl_2$ based on the Zn were placed in a deposition apparatus as the material supply sources. The interior of the apparatus was then evacuated to a pressure of $5\times10^{-3}$ Pa. Next, using an electron gun with an accelerating voltage of 5 kV, the material supply sources were calcined by irradiating them with an electron beam which scanned 3-cm-square regions. Since the material supply sources are heated if the emission current is gradually increased from 2 mA, the temperature of the material supply sources was measured with a radiation thermometer so that the heating rate could be controlled to 200° C./min. Once the emission current reaches 20 mA, the material supply sources are sufficiently heated, and volatization begins. Subsequently, the emission current was gradually decreased so as to control the cooling rate to 600° C./min, whereby the calcination of the material supply sources was finished.

Next, Cu and the $MgCl_2$-containing zinc sulfide compound were deposited to a film thickness of 500 nm at a material supply rate of, respectively, 7.2 nm/min and 580 nm/min, under a hydrogen sulfide atmosphere at a pressure of $1\times10^{-3}$ Pa while keeping the substrate temperature at 600° C. X-ray fluorescence analysis of the composition of the obtained light-emitting film showed that Cu/Zn was 2.51 mol %, Mg/Zn was 0.10 mol %, and Cl/Zn was 0.13 mol %. Further, in X-ray diffraction analysis using CuK α-rays, main peaks could be seen in the vicinity of 2θ=28.7°, 33.1°, 47.7°, and 56.6°, thus showing that the light-emitting film was a polycrystalline film having a good zinc blende structure. Further, when the light-emitting film was irradiated with 312 nm ultraviolet rays using an ultraviolet ray lamp, blue light having a center wavelength of 465 mm was emitted. In addition, the electroconductivity of the light-emitting film on the quartz substrate was measured by a four-tip probe measuring device to be 0.42 Ωcm.

Thus, a light-emitting film having blue light-emitting capabilities could be obtained concomitantly including in the zinc sulfide compound Cu as a first addition element, Mg as a second addition element, and Cl as a third addition element, wherein the added amount of the second addition element was smaller than the added amount of the first addition element.

Especially, when adding Mg to the zinc sulfide compound, by adding as $MgCl_2$ which has a lower melting point than the zinc sulfide compound, the crystallinity of the zinc sulfide compound as the base material is improved due to fusing agent effects. Further, it is also thought that the addition elements of Cu and Cl are more easily incorporated into the zinc sulfide compound as donors and acceptors. As a result of the above, a blue light-emitting film could be obtained which is brighter than a conventional film.

Example 8

In the present example, the light-emitting film which includes an addition element in a zinc sulfide compound is produced. Here, a light-emitting film is deposited on an Si or a quartz substrate using the electron beam vacuum vapor deposition apparatus illustrated in FIG. 8.

First, Cu metal (36A) and a zinc sulfide compound (36B) containing 0.1 mol % of $BaCl_2$ based on the Zn were placed in a deposition apparatus as the material supply sources. The interior of the apparatus was then evacuated to a pressure of $5\times10^{-3}$ Pa. Next, using an electron gun with an accelerating voltage of 5 kV, the material supply sources were calcined by irradiating them with an electron beam which scanned 3-cm-square regions. Since the material supply sources are heated if the emission current is gradually increased from 2 mA, the temperature of the material supply sources was measured with a radiation thermometer so that the heating rate could be controlled to 500° C./min. Once the emission current reaches 20 mA, the material supply sources are sufficiently heated, and volatization began. Subsequently, the emission current was gradually decreased so as to control the cooling rate to 900° C./min, whereby the calcination of the material supply sources was finished.

Next, deposition was carried out under a hydrogen sulfide atmosphere at a pressure of $1\times10^{-3}$ Pa while keeping the substrate temperature at 600° C. At this stage, the Cu material supply rate (nm/min) was selected within 0.6 to 60 nm/min, and the zinc sulfide compound material supply rate was fixed at 600 nm/min. By varying the ratio of material supply sources in this manner, light-emitting films 1 to 5 were produced having different added amounts of Cu. The composition of these light-emitting films was subjected to X-ray fluorescence analysis and their electroconductivity was measured by a four-tip probe measuring device. The results shown in the above Table 1 were obtained.

If the added amount of Cu in a light-emitting film is varied between 0.78 and 19 mol % based on the Zn, the resistivity of the light-emitting film also varied between 0.13 and 1.1 Ωcm. Further, as shown in Table 2, evaluation of PL (photoluminescence) intensity using ultraviolet rays showed that PL intensity increased when the added amount of Cu was low and decreased when the added amount of Cu was large. Thus, it was learned that by controlling the added amount of Cu in the range of 1.0 to 10 mol % based on the Zn, a light-emitting film can be obtained which combines light-emitting capabilities and a desired resistivity.

A light-emitting film having blue light-emitting capabilities could thus be obtained concomitantly including in the zinc sulfide compound Cu as a first addition element, Ba as a second addition element, and Cl as a third addition element, wherein the added amount of the second addition element was smaller than the added amount of the first addition element.

Especially, when adding Ba to the zinc sulfide compound, by adding as $BaCl_2$ which has a lower melting point than the zinc sulfide compound, the crystallinity of the zinc sulfide compound as the base material is improved due to fusing agent effects. Further, it is also thought that the addition elements of Cu and Cl are more easily incorporated into the zinc sulfide compound as donors and acceptors. As a result of the above, a bright blue light-emitting film could be obtained.

Further, by including a large amount of Cu the resistivity of a light-emitting film could be controlled, thus enabling a bright blue light-emitting film which combines light-emitting capabilities and a desired resistivity to be obtained.

Example 9

In the present example, a light-emitting device using a light-emitting film which includes an addition element in the zinc sulfide compound is produced.

First, as illustrated in FIG. 5, a film 12 having a greater resistivity than the light-emitting film was deposited on a low-resistance Si substrate, a conductive substrate 11, to a film thickness of 20 nm with $Al_2O_3$ as the material supply source using an electron beam vacuum vapor deposition apparatus. During the deposition, the pressure was $1\times10^{-3}$ Pa, the material supply rate was 12 nm/min, and the substrate temperature was kept at 200° C.

At this stage, deposition was carried out on a quartz substrate under identical conditions. As illustrated in FIG. 13, from measurement of the light transmission spectrum of the film having a greater resistivity than the light-emitting film, a gentle light absorption could be seen in the wavelength region of 500 nm or less, where absorption would not be seen for a completely $Al_2O_2$ (sapphire) film. Thus, it is inferred that the film had a pale brown color, and had an oxygen deficiency.

Next, a light-emitting film 13 is deposited using the electron beam vacuum vapor deposition apparatus illustrated in FIG. 8. Cu metal (36A) and a zinc sulfide compound (36B) containing 0.1 mol % of $BaCl_2$ based on the Zn were placed in a deposition apparatus as the material supply sources. The interior of the apparatus was then evacuated to a pressure of $5\times10^{-3}$ Pa.

First, using an electron gun with an accelerating voltage of 5 kV, the material supply sources were calcined by irradiating them with an electron beam which scanned 3-cm-square regions. Since the material supply sources are heated if the emission current is gradually increased from 2 mA, the temperature of the material supply sources was measured with a radiation thermometer so that the heating rate could be controlled to 500° C./min. Once the emission current reaches 20 mA, the material supply sources are sufficiently heated, and volatization begins. Subsequently, the emission current was gradually decreased so as to control the cooling rate to 900° C./min, whereby the calcination of the material supply sources was finished.

Next, deposition was carried out to a film thickness of 500 nm under a hydrogen sulfide atmosphere and at a pressure of $1\times10^{-3}$ Pa while keeping the substrate temperature at 600° C. with the material supply rate for Cu set to 7.7 nm/min and that for the zinc sulfide compound set to 550 nm/min. X-ray fluorescence analysis of the composition of the obtained light-emitting film showed that Cu/Zn was 3.52 mol %, Ba/Zn was 0.15 mol %, and Cl/Zn was 0.14 mol %. Further, in X-ray diffraction analysis using CuK α-rays, main peaks could be seen in the vicinity of 2θ=28.7°, 33.1°, 47.7°, and 56.6°, thus showing that the light-emitting film was a polycrystalline film having a good zinc blende structure. Further, when the light-emitting film was irradiated with 312 nm ultraviolet rays using an ultraviolet ray lamp, blue light having a center wavelength of 465 mm was emitted. In addition, the electroconductivity of the light-emitting film on the quartz substrate was measured by a four-tip probe measuring device to be 0.21 Ωcm.

Further, a transparent electrode film 14 was deposited to a film thickness of 400 nm under a pressure of 1 Pa at a deposition rate of 10 nm/min while flowing argon gas using a magnetron sputtering apparatus with ITO ($SnO_2$=5 wt %) used as a target.

Figure 15:
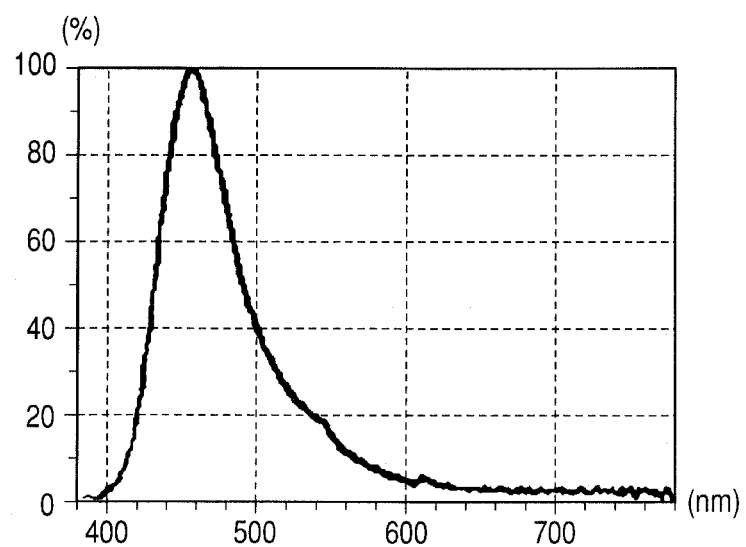
FIG. 15 is a diagram illustrating the emission spectrum of a light-emitting device according to one embodiment of the present invention.

When voltage was applied to the thus-produced light-emitting device between the conductive substrate 11 and the transparent electrode film 14 using a power source 15, blue light 16 which gradually became brighter was emitted at about 20 V. The emission spectrum was like that illustrated in FIG. 15, with a center wavelength of 454 nm and a half value width of 60 nm.

For the produced light-emitting device, the differential resistivity of the light-emitting device when not emitting light (when applied with 10 V) was about 1/41 the differential resistivity of the light-emitting device when emitting light (when applied with 30 V).

Further, various light-emitting devices with the same structure as described above were produced using the light-emitting films 1 to 5 of Example 8. Evaluation of these devices showed that when the added amount of Cu in the light-emitting film 2 was low, although the drive voltage increased due to a slightly higher resistivity, the emitted luminance was improved due to the fact that the relative value of the PL intensity did not decrease by much. On the other hand, when the added amount of Cu in the light-emitting film 4 was high, although the emitted luminance decreased due to the fact that the relative value of the PL intensity decreased, the drive voltage could be decreased because resistivity was low. Thus, the light-emitting device could be used differently depending on the intended purpose.

Thus, a light-emitting device using a light-emitting film having blue light-emitting capabilities could be obtained concomitantly including in the zinc sulfide compound Cu as a first addition element, Ba as a second addition element, and Cl as a third addition element, wherein the added amount of the second addition element was smaller than the added amount of the first addition element.

Especially, when adding Ba to the zinc sulfide compound, by adding as $BaCl_2$ which has a lower melting point than the zinc sulfide compound, the crystallinity of the zinc sulfide compound as the base material was improved due to fusing agent effects. Further, it is also thought that the addition elements of Cu and Cl are more easily incorporated into the zinc sulfide compound as donors and acceptors. As a result of the above, a bright blue light-emitting film could be obtained.

Further, by including a large amount of Cu the resistivity of the light-emitting film could be controlled, thus enabling a bright blue light-emitting film which combines light-emitting capabilities and a desired resistivity to be obtained.

By laminating such a blue light-emitting film, a film having a large resistivity, and an electrode film on a substrate, the carrier injection properties into the light-emitting layer are improved, thereby enabling a bright, blue light-emitting device to be obtained at a low voltage.

Example 10

In the present example, a light-emitting device using a light-emitting film which includes an addition element in the zinc sulfide compound is produced.

As illustrated in FIG. 6, using a magnetron sputtering apparatus, a transparent electrode film 14 was deposited to a film thickness of 300 nm on a quartz substrate as the transparent substrate 21 under a pressure of 1 Pa at a deposition rate of 10 nm/min while flowing argon gas using an ITO ($SnO_2$=5 wt %) target.

Next, $Cu_2ZnGe_xSi_{1-x}S_4$ as a p-type semiconductor film 23 was produced using a vacuum vapor deposition apparatus with Cu metal and ZnS containing Ge and Si (Zn:Ge:Si mole ratio=1:0.2:0.8) as the material supply sources. Specifically, a multinary compound semiconductor 23 was deposited to a film thickness of 100 nm at a pressure of $5 \times 10^{-2}$ Pa while keeping the substrate temperature at 580° C. and while flowing hydrogen sulfide gas with a deposition rate for the Cu of 21 nm/min and a deposition rate for the ZnS containing Ge and Si of 84 nm/min.

Next, a light-emitting film 13 is deposited using the electron beam vacuum vapor deposition apparatus illustrated in FIG. 8. Cu metal (36A) and a zinc sulfide compound (36B) containing 0.1 mol % of $IrCl_3$ based on the Zn were placed in a deposition apparatus as the material supply sources. The interior of the apparatus was then evacuated to a pressure of $5 \times 10^{-3}$ Pa.

First, using an electron gun with an accelerating voltage of 5 kV, the material supply sources were calcined by irradiating them with an electron beam which scanned 3-cm-square regions. Since the material supply sources are heated if the emission current is gradually increased from 2 mA, the temperature of the material supply sources was measured with a radiation thermometer so that the heating rate could be controlled to 400° C./min. Once the emission current reaches 20 mA, the material supply sources are sufficiently heated, and volatization began. Subsequently, the emission current was gradually decreased so as to control the cooling rate to 600° C./min, whereby the calcination of the material supply sources was finished.

Next, deposition was carried out under a hydrogen sulfide atmosphere at a pressure of $1 \times 10^{-3}$ Pa while keeping the substrate temperature at 600° C. Deposition was carried out to a film thickness of 200 nm with a Cu material supply rate of 7.4 nm/min, and the zinc sulfide compound material supply rate of 580 nm/min.

Next, the film 12 having a greater resistivity than the light-emitting film was deposited using a magnetron sputtering apparatus to a film thickness of 100 nm under a pressure of 1 Pa at a deposition rate of 3 nm/min while flowing argon gas and using an AlN target.

Figure 16:
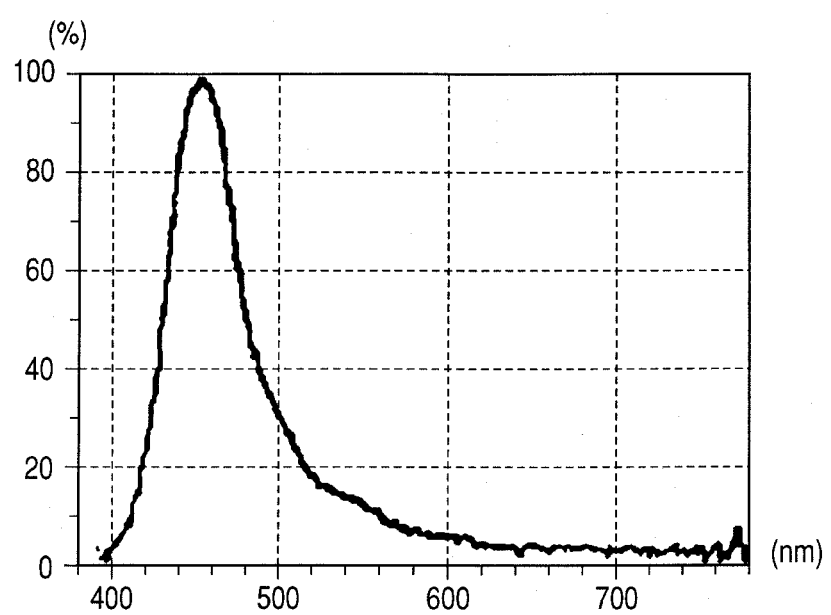
FIG. 16 is a diagram illustrating the emission spectrum of a light-emitting device according to one embodiment of the present invention.

Next, the electrode film 22 was deposited using an electron beam vacuum vapor deposition apparatus to a film thickness of 80 nm under a pressure of $5 \times 10^4$ Pa at a deposition rate of 30 nm/min with Al metal as a material supply source. When voltage was applied to the thus-produced light-emitting device between the transparent electrode film 14 and electrode film 22 using the power source 15, blue light 16 which gradually became brighter was emitted at about 15 V. The emission spectrum was like that illustrated in FIG. 16, with a center wavelength of 453 nm and a half value width of 50 nm. The emission spectrum was narrower than that illustrated in Example 9, which shows a superior color purity of blue color.

For the produced light-emitting device, the differential resistivity of the light-emitting device when not emitting light (when applied with 10 V) was about ¼ the differential resistivity of the light-emitting device when emitting light (when applied with 30 V).

Thus, a light-emitting device using a light-emitting film having blue light-emitting capabilities could be obtained concomitantly including in the zinc sulfide compound Cu as a first addition element, Ir as a second addition element, and Cl as a third addition element, wherein the added amount of the second addition element was smaller than the added amount of the first addition element.

Especially, when adding Ir to the zinc sulfide compound, by adding as $IrCl_3$ which has a lower melting point than the zinc sulfide compound, the crystallinity of the zinc sulfide compound as the base material was improved due to fusing agent effects. Further, it is also thought that the addition elements of Cu and Cl are more easily incorporated into the zinc sulfide compound as donors and acceptors. As a result of the above, a bright blue light-emitting film could be obtained.

Further, by including a large amount of Cu the resistivity of the light-emitting film could be controlled, thus enabling a bright blue light-emitting film which combines light-emitting capabilities and a desired resistivity to be obtained.

By laminating this blue light-emitting film, a p-type semiconductor film, and an electrode film on a substrate, the hole injection properties into the light-emitting layer are improved, thereby enabling a bright, blue light-emitting device to be obtained at a low voltage.

Example 11

In the present example, a light-emitting device was produced using the light-emitting film according to the present invention including an addition element in a zinc sulfide compound having sites formed of copper sulfide on the ZnS crystal grain boundary of the present invention. The structure of this light-emitting device was analyzed in detail.

Figure 17:
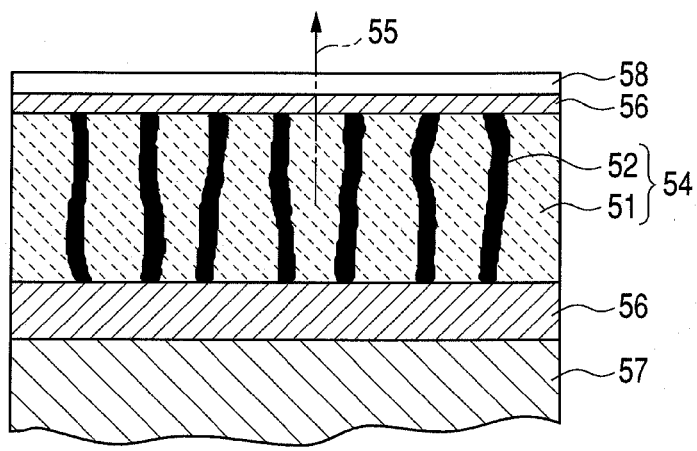
FIG. 17 is a schematic diagram illustrating a cross-sectional view of the light-emitting device according to the present invention.

As illustrated in FIG. 17, $Al_2O_3$ as a high-resistance film 56 was deposited on a low-resistance Si substrate as the conductive substrate 57 to a film thickness of 20 nm at a pressure of $1 \times 10^{-3}$ Pa and a material supply rate of 12 nm/min while keeping the substrate temperature at 200° C. Next, as the light-emitting film 54, Cu metal and a ZnS compound containing 0.1 mol % of $BaCl_2$ based on the Zn were placed in an electron beam vacuum deposition apparatus as the supply sources. The interior of the apparatus was then evacuated to a pressure of $5 \times 10^{-3}$ Pa.

First, using an electron gun with an accelerating voltage of 5 kV, the material supply sources were calcined by irradiating them with an electron beam which scanned 3-cm-square regions. Since the material supply sources are heated if the emission current is gradually increased from 2 mA, the temperature of the material supply sources was measured with a radiation thermometer so that the heating rate could be controlled to 500° C./min. Once the emission current reaches 20 mA, the material supply sources are sufficiently heated, and volatization began. Subsequently, the emission current is gradually decreased so as to control the cooling rate to 900° C./min, whereby the calcination of the material supply sources is finished. Next, deposition was carried out to a film thickness of 1,200 nm under a hydrogen sulfide atmosphere and at a pressure of $1 \times 10^{-3}$ Pa while keeping the substrate temperature at 600° C. with the material supply rate for Cu set to 7.7 nm/min and that for the zinc sulfide compound set to 550 nm/min. X-ray fluorescence analysis of the composition of the obtained light-emitting film showed that Cu/Zn was 3.45 mol %, Ba/Zn was 0.14 mol %, and Cl/Zn was 0.13 mol %. Further, in X-ray diffraction analysis using CuK α-rays, main peaks could be seen in the vicinity of 2θ=28.7°, 33.1°, 47.7°, and 56.6°, thus showing that the light-emitting film was a polycrystalline film having a good zinc blende structure. Further, when the light-emitting film was irradiated with 312 nm ultraviolet rays using an ultraviolet ray lamp, blue light having a center wavelength of 465 mm was emitted. In addition, the electroconductivity of the light-emitting film on the quartz substrate was measured by a four-tip probe measuring device to be 0.24 Ωcm.

Further, $Al_2O_3$ as a high-resistance film 56 was deposited to a film thickness of 20 nm at a pressure of $1\times10^{-3}$ Pa and a material supply rate of 12 nm/min while keeping the substrate temperature at 200° C. Then, a transparent electrode film 58 was deposited to a film thickness of 400 nm under a pressure of 1 Pa at a deposition rate of 10 nm/min while flowing argon gas using a magnetron sputtering apparatus with ITO ($SnO_2$=5 wt %) used as a target to produce a light-emitting device.

Figure 18:
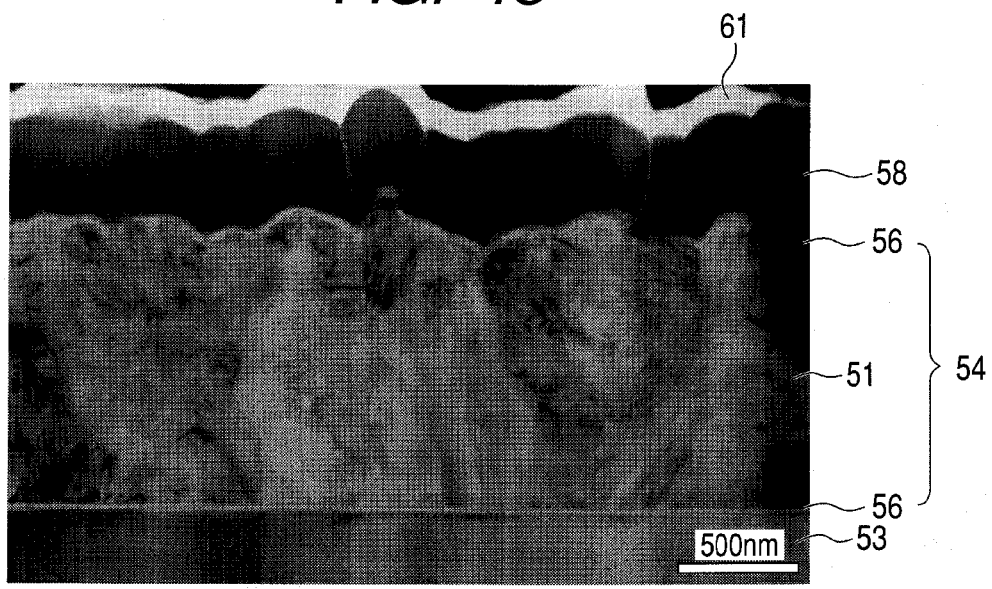
FIG. 18 is a cross-sectional TEM image of the light-emitting film according to the present invention.

FIG. 18 illustrates the observation results of the cross-section of the produced light-emitting device using a transmission electron microscope (TEM). Further, analysis of using TEM, EDX, and EELS in the same manner as in Example 3 showed that, as illustrated in FIG. 17, the light-emitting film 54 was formed by ZnS crystals 51 with a diameter of 300 to 500 nm grown perpendicularly. The ZnS crystals 51 had a structure containing hexagonal crystal wurtzite and a large amount of stacking fault hexagonal crystal zinc blende structures. At the grain boundary where ZnS crystals are in contact with each other, a deposit of $Cu_xS$ 52 could be seen in the region having a thickness of 3 nm or less. From EELS evaluation, the $Cu_xS$ 52 at the grain boundary had a composition close to $Cu_2S$ with x=2. There was very little $Cu_xS$ 52 deposited at the boundary between the ZnS crystals 51 and the high-resistance film 56. The deposited amount was 1/30 or less that of the deposited amount at the grain boundary between ZnS crystals 51. When voltage was applied to the produced light-emitting device between the conductive substrate 57 and the transparent electrode 58, blue light 55 which gradually became brighter was emitted at about 20 V.

Example 12

In the present example, a light-emitting device was produced using the light-emitting film according to the present invention including an addition element in a zinc sulfide compound having sites formed of copper sulfide on the ZnS crystal grain boundary of the present invention. The structure of this light-emitting device was analyzed in detail.

As illustrated in FIG. 17, $Al_2O_3$ as a high-resistance film 56 was deposited on a low-resistance Si substrate as the conductive substrate 57 to a film thickness of 20 nm at a pressure of $1\times10^{-3}$ Pa and a material supply rate of 12 nm/min while keeping the substrate temperature at 200° C. Next, as the light-emitting film 54, Cu metal and a ZnS compound containing 0.25 mol % of $IrCl_3$ based on the Zn were placed in an electron beam vacuum deposition apparatus as the supply sources. The interior of the apparatus was then evacuated to a pressure of $5\times10^{-3}$ Pa.

First, using an electron gun with an accelerating voltage of 5 kV, the material supply sources were calcined by irradiating them with an electron beam which scanned 3-cm-square regions. Since the material supply sources are heated if the emission current is gradually increased from 2 mA, the temperature of the material supply sources was measured with a radiation thermometer so that the heating rate could be controlled to 400° C./min. Once the emission current reaches 20 mA, the material supply sources are sufficiently heated, and volatization began. Subsequently, the emission current is gradually decreased so as to control the cooling rate to 600° C./min, whereby the calcination of the material supply sources is finished. Next, deposition was carried out to a film thickness of 680 nm under a hydrogen sulfide atmosphere and at a pressure of $1\times10^{-3}$ Pa while keeping the substrate temperature at 600° C. with the material supply rate for Cu set to 7.4 nm/min and that for the zinc sulfide compound set to 580 nm/min. In X-ray diffraction analysis of the obtained light-emitting film using CuK α-rays, main peaks could be seen in the vicinity of 2θ=28.7°, 33.1°, 47.7°, and 56.6°, thus showing that the light-emitting film was a polycrystalline film having a good zinc blende structure. Further, when the light-emitting film was irradiated with 312 nm ultraviolet rays using an ultraviolet ray lamp, blue light having a center wavelength of 465 mm was emitted. In addition, the electroconductivity of the light-emitting film on the quartz substrate was measured by a four-tip probe measuring device to be 0.27 Ωcm.

Further, $Al_2O_3$ as a high-resistance film 56 was deposited to a film thickness of 20 nm at a pressure of $1\times10^{-3}$ Pa and a material supply rate of 12 nm/min while keeping the substrate temperature at 200° C. Then, a transparent electrode film 58 was deposited to a film thickness of 400 nm under a pressure of 1 Pa at a deposition rate of 10 nm/min while flowing argon gas using a magnetron sputtering apparatus with ITO ($SnO_2$=5 wt %) used as a target to produce a light-emitting device.

Figure 19:
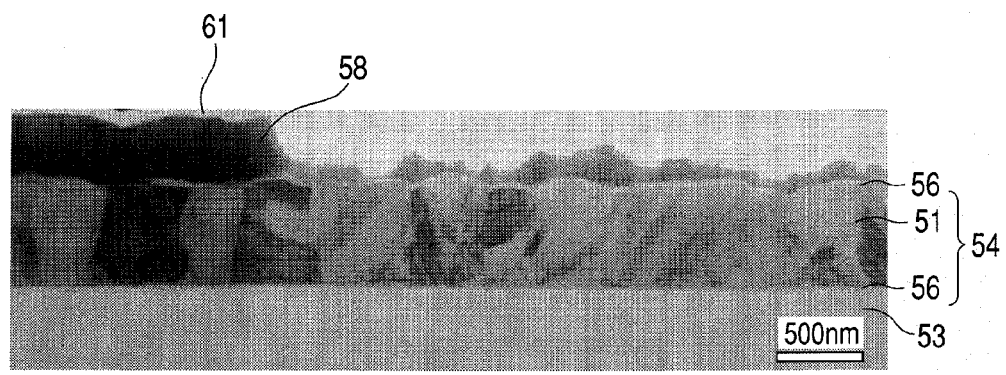
FIG. 19 is a cross-sectional TEM image of the light-emitting film according to the present invention.

FIG. 19 illustrates the observation results of the cross-section of the produced light-emitting device using a transmission electron microscope (TEM). The surface flatness and crystal grains of the light-emitting film 54 according to the present example are flatter and better defined compared with Example 11, and thus the production of a light-emitting device was easier. Further, analysis of using TEM, EDX, and EELS in the same manner as in Example 3 showed that, as illustrated in FIG. 17, the light-emitting film 54 was formed by ZnS crystals 51 with a diameter of 300 to 500 nm grown perpendicularly. The ZnS crystals 51 had a structure containing hexagonal crystal wurtzite and a large amount of stacking fault hexagonal crystal zinc blende structures. At the grain boundary where ZnS crystals are in contact with each other, a deposit of $Cu_xS$ 52 could be seen in the region having a thickness of 3 nm or less. From EELS evaluation, the $Cu_xS$ 52 at the grain boundary had a composition close to $Cu_2S$ with x=2. There was very little $Cu_xS$ 52 deposited at the boundary between the ZnS crystals 51 and the high-resistance film 56. The deposited amount was 1/30 or less that of the deposited amount at the grain boundary between ZnS crystals 51. When voltage was applied to the produced light-emitting device between the conductive substrate 57 and the transparent electrode 58, blue light 55 which gradually became brighter was emitted at about 20 V.

The present invention can be utilized in light-emitting devices driven at a low voltage, and more specifically, in LEDs and inorganic ELs.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for producing a light-emitting film, comprising depositing a light-emitting film by supplying Cu metal and a zinc sulfide compound onto a substrate in a hydrogen sulfide atmosphere, wherein
the ratio between the Cu metal supply rate (nm/min) and the zinc sulfide compound supply rate (nm/min) is 1:1,000 or more and 1:10 or less.

2. The method for producing a light-emitting film according to claim 1, wherein the deposition rate during the deposition is 100 nm/min or more and 5,000 nm/min or less.

3. The method for producing a light-emitting film according to claim 1, wherein the substrate is kept at a temperature of 500° C. or more and less than 1,000° C. during the deposition.

4. The method for producing a light-emitting film according to claim 1, wherein the zinc sulfide compound supplied onto the substrate comprises one or more elements selected from the group consisting of group 3B (group 13) and group 7B (group 17) of the periodic table.

5. The method for producing a light-emitting film according to claim 1, wherein the zinc sulfide compound supplied onto the substrate contains a chloride of a group 2 element or Ir.

6. The method for producing a light-emitting film according to claim 5, comprising, prior to the deposition, rapidly heating the zinc sulfide compound which contains a chloride of a group 2 element or Ir in a deposition apparatus kept in a vacuum, and then rapidly cooling the zinc sulfide compound.

7. The method for producing a light-emitting film according to claim 6, wherein the heating rate during the rapid heating is 100° C./min or more and 1,000° C./min or less.

8. The method for producing a light-emitting film according to claim 6, wherein the cooling rate during the rapid cooling is 500° C./min or more.

9. A method for producing a light-emitting device at least comprising:
depositing a first film onto a substrate;
depositing a light-emitting film by the method according to claim 1 onto the first film; and
depositing a transparent electrode film onto the light-emitting film,
wherein the first film has a greater resistivity than the light-emitting film.

10. A method for producing a light-emitting device at least comprising:
depositing a transparent electrode film onto a transparent substrate;
depositing a p-type semiconductor film onto the transparent electrode film;
depositing the light-emitting film by the method according to claim 1 onto the p-type semiconductor film;
depositing a film having a greater resistivity than the light-emitting film onto the light-emitting film; and
depositing an electrode film onto the film having a greater resistivity than the light-emitting film.

* * * * *